(12) United States Patent
Ohki

(10) Patent No.: US 11,038,045 B2
(45) Date of Patent: Jun. 15, 2021

(54) SEMICONDUCTOR DEVICE

(71) Applicant: FUJITSU LIMITED, Kawasaki (JP)

(72) Inventor: Toshihiro Ohki, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 31 days.

(21) Appl. No.: 16/261,078

(22) Filed: Jan. 29, 2019

(65) Prior Publication Data

US 2019/0280110 A1    Sep. 12, 2019

(30) Foreign Application Priority Data

Mar. 12, 2018  (JP) .............................. JP2018-044442

(51) Int. Cl.
*H01L 29/778*    (2006.01)
*H01L 29/20*    (2006.01)
*H01L 29/06*    (2006.01)

(52) U.S. Cl.
CPC ...... *H01L 29/7783* (2013.01); *H01L 29/0657* (2013.01); *H01L 29/2003* (2013.01); *H01L 29/7787* (2013.01)

(58) Field of Classification Search
CPC ............. H01L 51/0097; H01L 27/3246; H01L 27/3276; H01L 51/5253; H01L 2251/5338; H01L 25/167; H01L 25/048; H01L 25/0753; H01L 29/66431; H01L 29/66462; H01L 29/778–7786; H01L 29/66242; H01L 29/66318; H01L 29/737
See application file for complete search history.

(56) References Cited

U.S. PATENT DOCUMENTS

2014/0159048 A1*  6/2014  Huang ................ H01L 29/0657
                                                            257/76
2016/0172474 A1*  6/2016  Miyake ............... H01L 29/4236
                                                            257/76

FOREIGN PATENT DOCUMENTS

| JP | 2002-359256 | 12/2002 |
| JP | 2003-347315 | 12/2003 |
| JP | 2007-88185  | 4/2007  |

* cited by examiner

*Primary Examiner* — Cuong B Nguyen
(74) *Attorney, Agent, or Firm* — Fujitsu Patent Center

(57) ABSTRACT

A semiconductor device includes a back barrier layer formed over a substrate, a first electron transit layer formed over the back barrier layer, an opening formed in the first electron transit layer and the back barrier layer, a second electron transit layer formed over the first electron transit layer, a side surface of the first electron transit layer at a side surface within the opening, a side surface of the back barrier layer at a side surface within the opening, and a surface of the back barrier layer at a bottom surface within the opening, an electron supply layer formed over the second electron transit layer, a drain electrode formed over the electron supply layer within the opening, and a gate electrode formed to cover a side surface of the electron supply layer at a side surface within the opening from an edge part of the opening.

9 Claims, 20 Drawing Sheets

SEMICONDUCTOR DEVICE

CROSS-REFERENCE TO RELATED APPLICATION

This application is based upon and claims the benefit of priority of the prior Japanese Patent Application No. 2018-44442, filed on Mar. 12, 2018, the entire contents of which are incorporated herein by reference.

FIELD

The embodiments discussed herein are related to a semiconductor device and a method of manufacturing a semiconductor device.

BACKGROUND

GaN, AlN, and InN, which are nitride semiconductors, and materials and the like formed of mixed crystals of these nitride semiconductors have a wide band gap, and are used in high power electronic devices, short wavelength light emitting devices, and the like. For example, the band gap for GaN, which is a nitride semiconductor, is 3.4 eV and is greater than the band gap of Si, 1.1 eV, or the band gap of GaAs, 1.4 eV.

Examples of such high power electronic devices include high electron mobility transistors (HEMTs) as field effect transistors (FETs) (for example, Japanese Laid-open Patent Publication No. 2002-359256). HEMTs using a nitride semiconductor may be used for high power, high efficiency amplifiers, high power switching devices, and the like. In HEMTs using AlGaN for an electron supply layer and GaN for an electron transit layer, distortion due to the difference in lattice constants of AlGaN and GaN causes piezoelectric polarization or the like in AlGaN, thereby generating a two-dimensional electron gas (2DEG) of high concentration.

In HEMTs using AlGaN for an electron supply layer and GaN for an electron transit layer, OFF leakage current flows when the thickness of the electron transit layer is great. Therefore, studies have been made to reduce OFF leakage current. However, in HEMTs with a structure in which the electron transit layer is made thin in order to reduce OFF leakage current, the ON resistance is high.

Therefore, semiconductor devices with favorable characteristics of small OFF leakage current and low ON resistance are desired for semiconductor devices using a nitride semiconductor.

The followings are reference documents.
[Document 1] Japanese Laid-open Patent Publication No. 2007-88185 and
[Document 2] Japanese Laid-open Patent Publication No. 2003-347315.

SUMMARY

According to an aspect of the embodiments, a semiconductor device includes a back barrier layer formed of a compound semiconductor over a substrate, a first electron transit layer formed of a compound semiconductor over the back barrier layer, an opening formed in the first electron transit layer and the back barrier layer, a second electron transit layer formed of a compound semiconductor over the first electron transit layer, a side surface of the first electron transit layer at a side surface within the opening, a side surface of the back barrier layer at a side surface within the opening, and a surface of the back barrier layer at a bottom surface within the opening, an electron supply layer formed of a compound semiconductor over the second electron transit layer, a source electrode formed over the electron supply layer in a region in which the first electron transit layer is formed, a drain electrode formed over the electron supply layer within the opening, and a gate electrode formed to cover a side surface of the electron supply layer at a side surface within the opening from an edge part of the opening, wherein the first electron transit layer and the second electron transit layer between the source electrode and the gate electrode have a combined thickness greater than a thickness of the second electron transit layer between the gate electrode and the drain electrode.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
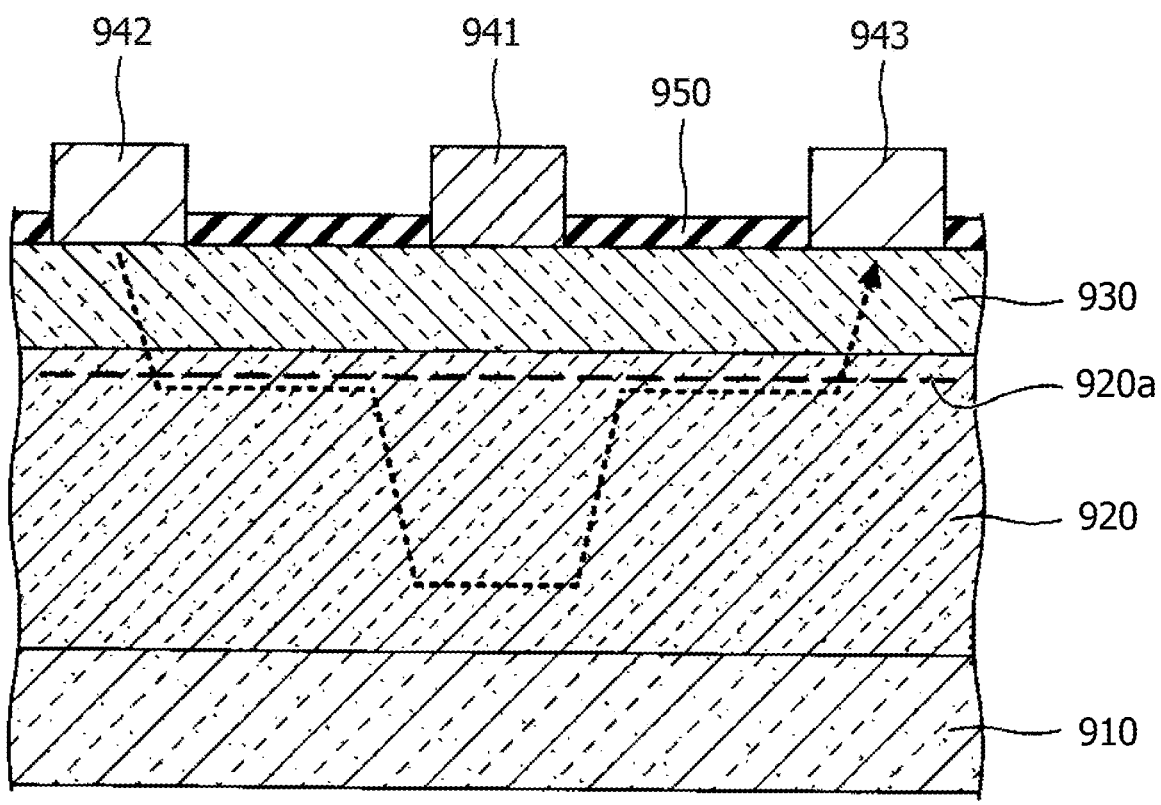
FIG. 1 is an illustrative view (1) of a semiconductor device using a nitride semiconductor.

Modes for implementation will be described below. The same members or the like are denoted by the same reference characters, and descriptions are omitted.

First Embodiment

First, OFF leakage in a semiconductor device using a nitride semiconductor will be described based on FIG. 1. In the semiconductor device illustrated in FIG. 1, an electron transit layer 920 and an electron supply layer 930 are stacked on a substrate 910. On the electron supply layer 930, a gate electrode 941, a source electrode 942, and a drain electrode 943 are formed. In a region in which the gate electrode 941, the source electrode 942, and the drain electrode 943 are not formed on the electron supply layer 930, an insulating film 950 is formed.

For the substrate 910, a SiC substrate or the like is used. The insulating film 950 is formed of SiN or the like. The electron transit layer 920 is formed of GaN. The electron supply layer 930 is formed of AlGaN. Accordingly, in the electron transit layer 920, a 2DEG 920a is generated in the vicinity of the boundary of the electron transit layer 920 and the electron supply layer 930.

In the semiconductor device with a structure illustrated in FIG. 1, the electron transit layer 920 is formed such that the thickness is greater than or equal to 1 µm, for example, 2 to 3 µm, in order to generate a sufficient amount of the 2DEG 920a in the electron transit layer 920. However, in the case where the electron transit layer 920 is formed to be thick, OFF leakage current flows in a deep portion of the electron transit layer 920 immediately below the gate electrode 941, as illustrated by a dashed arrow in FIG. 1, even when a voltage is applied such that the gate electrode 941 is off.

Figure 2:
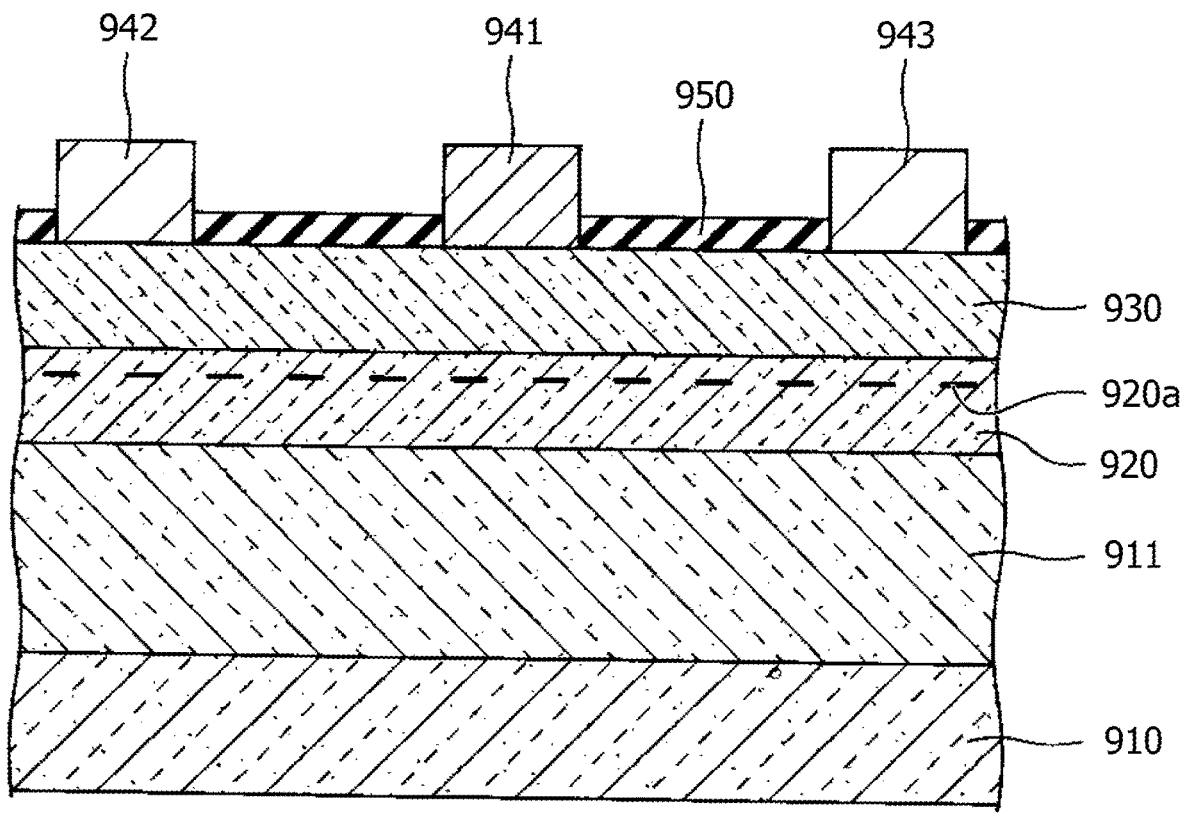
FIG. 2 is an illustrative view (2) of a semiconductor device using a nitride semiconductor.

Therefore, as illustrated in FIG. 2, a structure is conceivable in which a back barrier layer 911 is formed of AlGaN on the substrate 910 and the electron transit layer 920 and the electron supply layer 930 are stacked on the back barrier layer 911. In a semiconductor device with this structure, the thickness of the electron transit layer 920 is small at 200 to 300 µm, for example. The back barrier layer 911 being formed of AlGaN makes it difficult for current to flow, thus allowing a reduction in OFF current. However, when the thickness of the electron transit layer 920 is small, the density of the generated 2DEG 920a is low, and the ON resistance is high. Therefore, a transconductance gm becomes low.

Therefore, semiconductor devices with favorable characteristics of small OFF leakage current and low ON resistance are desired for semiconductor devices using a nitride semiconductor.

(Semiconductor Device)

Figure 3:
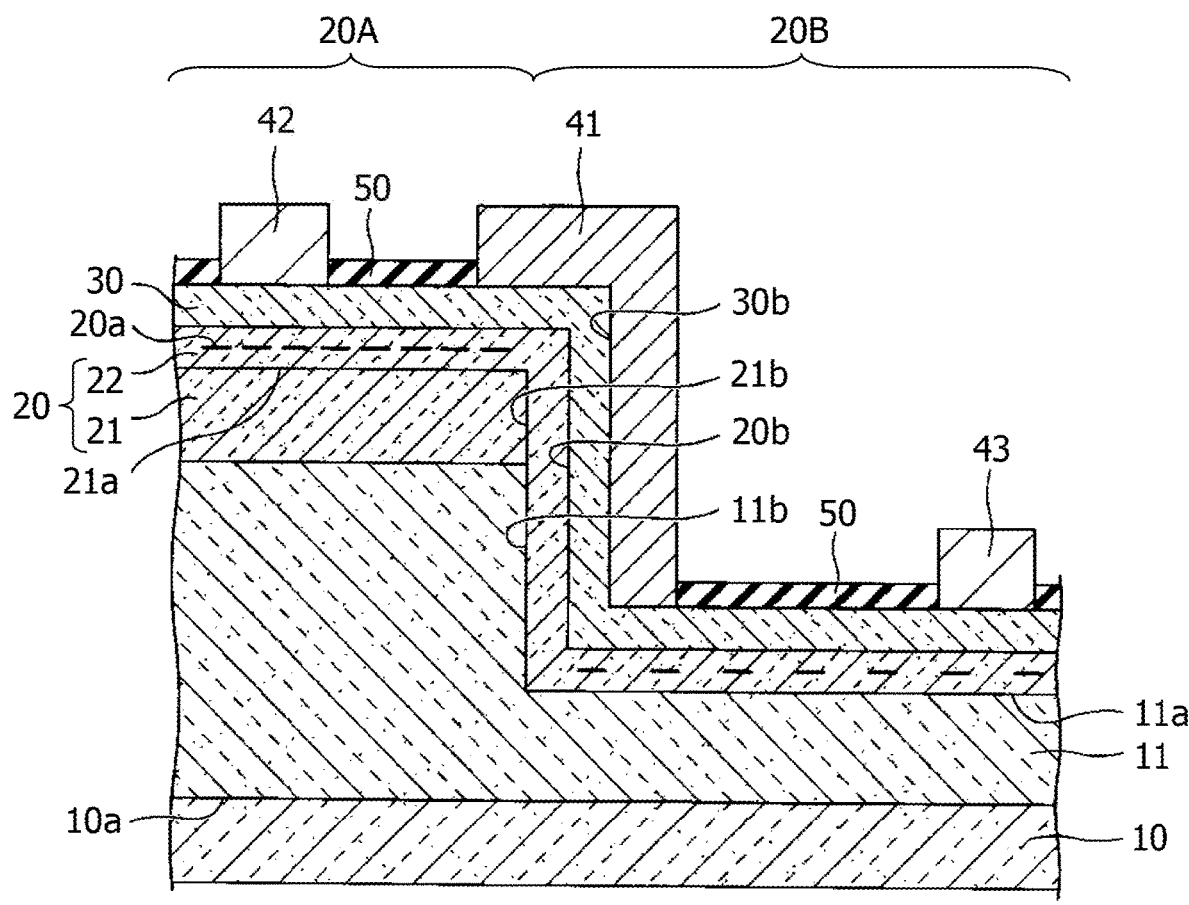
FIG. 3 is a structure view of a semiconductor device in a first embodiment.

Next, a semiconductor device in a first embodiment will be described based on FIG. 3. In the semiconductor device in this embodiment, a back barrier layer 11 is formed on a substrate 10, and an electron transit layer 20 and an electron supply layer 30 are stacked on the back barrier layer 11. The electron transit layer 20 is formed such that the thickness of a first region 20A between a source electrode 42 and a gate electrode 41 is greater than the thickness of a second region 20B between the gate electrode 41 and a drain electrode 43. Specifically, the electron transit layer 20 is formed of a first electron transit layer 21 and a second electron transit layer 22, for example. In the first region 20A, the first electron transit layer 21 and the second electron transit layer 22 are formed. In the second region 20B, only the second electron transit layer 22 is formed. Between the first region 20A and the second region 20B, a side surface 21b of the first electron transit layer 21 and a side surface 11b of the back barrier layer 11 that are substantially perpendicular to a surface 10a of the substrate 10 are formed, and the second electron transit layer 22 covering the side surface 21b and the side surface 11b is formed. The electron supply layer 30 is stacked on the second electron transit layer 22. The gate electrode 41 that contacts a side surface 30b of the electron supply layer 30 covering a side surface 20b of the electron transit layer 20 is formed.

In this embodiment, the source electrode 42 is formed on the electron supply layer 30 in the first region 20A in which the electron transit layer 20 is formed to be thick, and the drain electrode 43 is formed on the electron supply layer 30 in the second region 20B in which the electron transit layer 20 is formed to be thin. In a region excluding a region in which the gate electrode 41, the source electrode 42, and the drain electrode 43 are not formed on the electron supply layer 30, an insulating film 50 is formed.

For the substrate 10, a SiC substrate or the like whose surface 10a is on a c-plane is used. The insulating film 50 is formed of SiN or the like. The electron transit layer 20 is formed of GaN. The electron supply layer 30 is formed of AlGaN. In the electron transit layer 20 of this embodiment, surfaces substantially parallel to the surface 10a of the substrate 10 in the first region 20A between the source electrode 42 and the gate electrode 41 and surfaces substantially parallel to the surface 10a of the substrate 10 in the second region 20B between the drain electrode 43 and the gate electrode 41 are on a c-plane. Therefore, by forming the electron supply layer 30 on these surfaces, a 2DEG 20a is generated in the electron transit layer 20 in the vicinity of the boundary of the electron transit layer 20 and the electron supply layer 30.

The density of the 2DEG 20a generated in the electron transit layer 20 depends on the thickness of the electron transit layer 20. In the first region 20A in which the electron transit layer 20 is thick, the density of the 2DEG 20a is higher than in the second region 20B in which the electron transit layer 20 is thin. Thus, the resistance of the electron transit layer 20 between the source electrode 42 and the gate electrode 41 is low, allowing the ON resistance to be made low. Since the density of the 2DEG 20a is low in the electron transit layer 20 between the gate electrode 41 and the drain electrode 43, the withstand voltage between the gate electrode 41 and the drain electrode 43 is improved.

The side surface 21b of the first electron transit layer 21 and the side surface 11b of the back barrier layer 11 that are substantially perpendicular to the surface 10a of the substrate 10 between the first region 20A and the second region 20B are on an m-plane or an a-plane. The second electron transit layer 22 that contacts the side surface 21b of the first electron transit layer 21 and the side surface 11b of the back barrier layer 11 is formed, and the side surface 20b of the electron transit layer 20, which is the side surface of the second electron transit layer 22, is on an m-plane or an a-plane. The 2DEG 20*a* is not generated in this portion of the electron transit layer 20, even when the electron supply layer 30 that contacts the side surface 20*b* of the electron transit layer 20 is formed. This allows for a normally-off operation, and the occurrence of OFF leakage current is suppressed. In this application, m-planes are the (1-100) plane and planes parallel to the (1-100) plane, a-planes are the (11-20) plane and planes parallel to the (11-20) plane, and c-planes are the (0001) plane and planes parallel to the (0001) plane.

In this manner, this embodiment allows sneak current of the gate electrode 41 to be suppressed (OFF withstand voltage to be improved) without lowering the source resistance (without lowering the transconductance gm), and makes it possible for the withstand voltage between the gate electrode 41 and the drain electrode 43 to be high.

Since the step difference at the side surface 20*b* becomes the gate length in this embodiment, a semiconductor device with a short gate length may be prepared easily.

Figure 4:
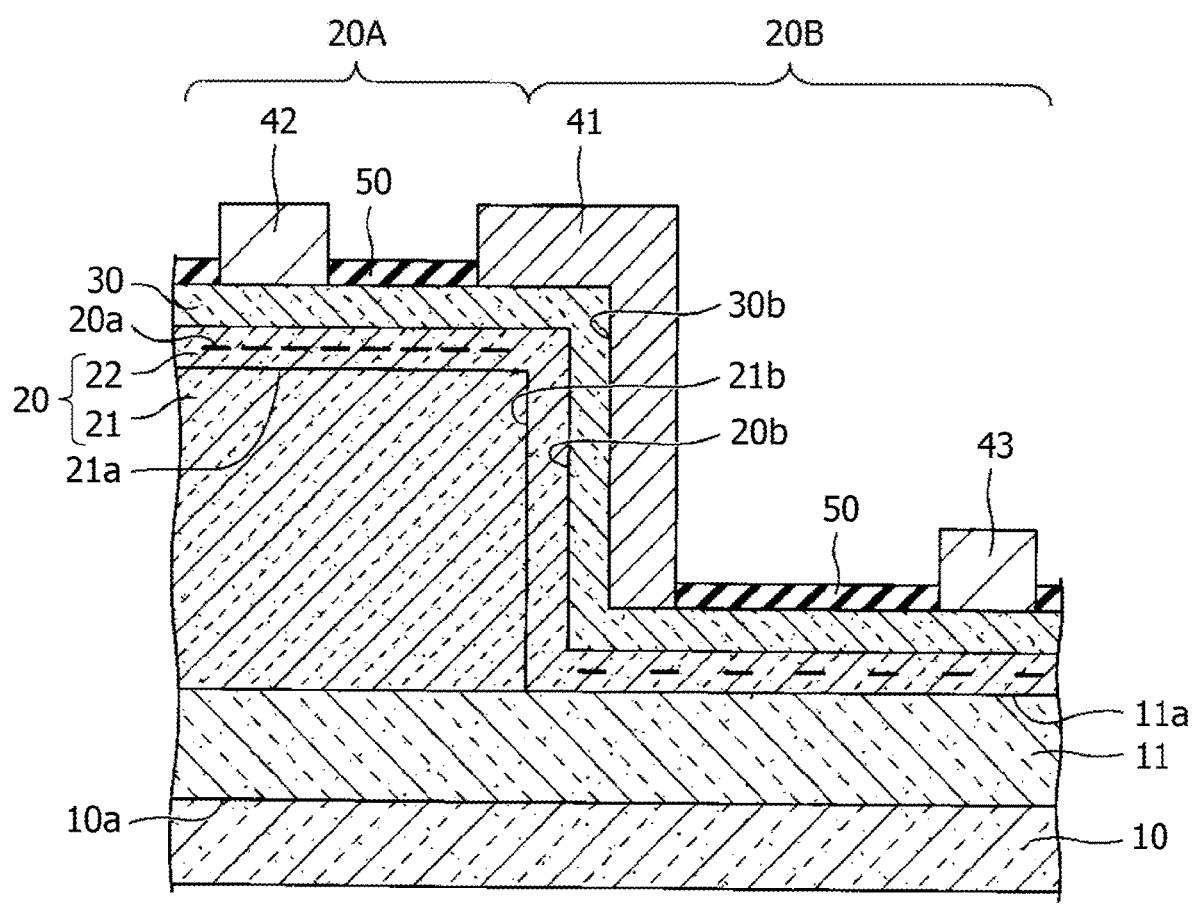
FIG. 4 is a structure view of another semiconductor device in the first embodiment.

As illustrated in FIG. 4, the semiconductor device in this embodiment may be such that, in a region in which the gate electrode 41 is formed, the surface substantially perpendicular to the surface 10*a* of the substrate 10 is formed only by the electron transit layer 20. That is, it may be such that the first electron transit layer 21 is formed in the first region 20A between the source electrode 42 and the gate electrode 41, but the first electron transit layer 21 is not formed in the second region 20B between the gate electrode 41 and the drain electrode 43, for example. With such a structure as well, the electron transit layer 20 is formed such that the first region 20A is thicker than the second region 20B.

(Method of Manufacturing Semiconductor Device)

Next, a method of manufacturing a semiconductor device in this embodiment will be described.

Figure 5A:
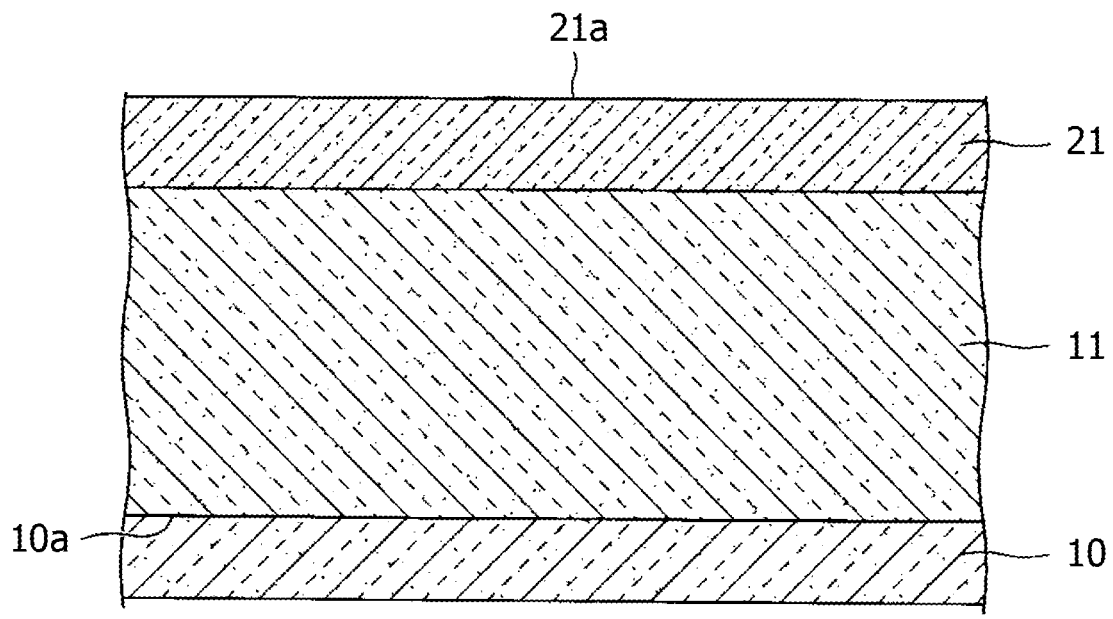
FIGS. 5A and 5B are views (1) of a process in a method of manufacturing a semiconductor device in the first embodiment.

First, as illustrated in FIG. 5A, the back barrier layer 11 and the first electron transit layer 21 are sequentially stacked and formed by epitaxial growth of a nitride semiconductor on the substrate 10. In this embodiment, the back barrier layer 11 and the first electron transit layer 21 are formed by epitaxial growth by metal-organic vapor phase epitaxy (MOVPE). The substrate 10 is formed of a semiconductor substrate of SiC or the like. The back barrier layer 11 is formed of AlGaN or the like. The first electron transit layer 21 is formed of i-GaN. Since the surface 10*a* of the substrate 10 is on a c-plane, a surface 21*a* of the first electron transit layer 21 formed by epitaxial growth is on a c-plane.

Figure 5B:
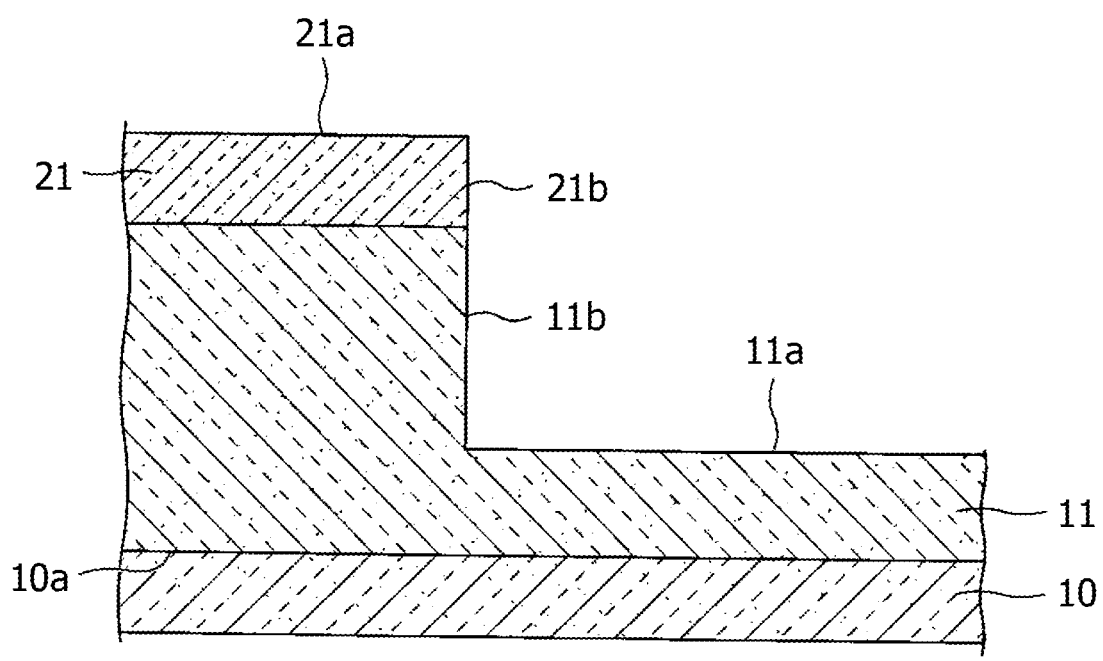

Next, as illustrated in FIG. 5B, part of the first electron transit layer 21 and the back barrier layer 11 in a region in which the drain electrode 43 is to be formed is removed. Specifically, by applying a photoresist onto the first electron transit layer 21 and performing exposure and development with an exposure device, a resist pattern, not illustrated, having an opening in a region in which part of the first electron transit layer 21 and the back barrier layer 11 is to be removed is formed, for example. Then, part of the first electron transit layer 21 and the back barrier layer 11 in a region in which the resist pattern is not formed is removed by dry etching, such as reactive ion etching (RIE) using a chlorine-based gas as an etching gas. Then, by performing wet etching, a c-plane is exposed at a surface 11*a* of the back barrier layer 11, and an m-plane is exposed at the side surface 21*b* of the first electron transit layer 21 and the side surface 11*b* of the back barrier layer 11. In this wet etching, an alkaline aqueous solution of tetramethylammonium hydroxide (TMAH), potassium hydroxide (KOH), or the like is used as a wet etchant.

Figure 6A:
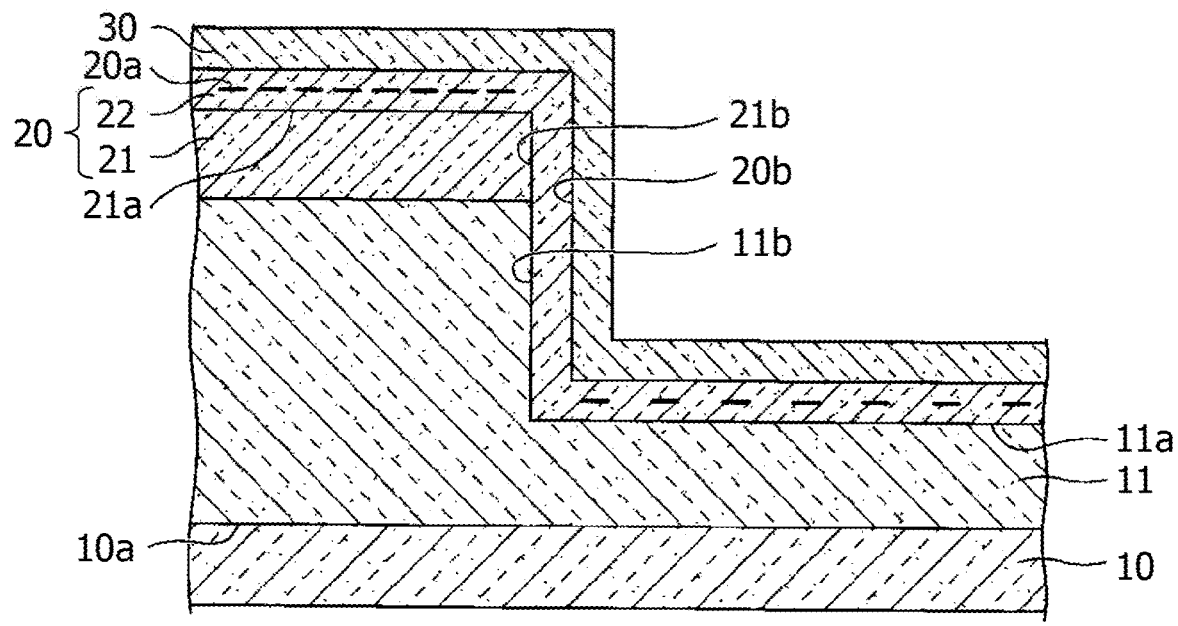
FIGS. 6A and 6B are views (2) of a process in the method of manufacturing a semiconductor device in the first embodiment.

Next, as illustrated in FIG. 6A, the second electron transit layer 22 and the electron supply layer 30 are sequentially formed by MOVPE on the surface 21*a* of the first electron transit layer 21, the side surface 21*b* of the first electron transit layer 21, the side surface 11*b* of the back barrier layer 11, and the surface 11*a* of the back barrier layer 11. The electron supply layer 30 is formed of i-AlGaN with a thickness of about 20 nm. Accordingly, in the second electron transit layer 22, the 2DEG 20*a* is generated in the vicinity of the boundary of the second electron transit layer 22 and the electron supply layer 30. The electron transit layer 20 is formed of the first electron transit layer 21 and the second electron transit layer 22 formed in this manner.

The 2DEG 20*a* is generated in a region in which the electron transit layer 20 is on a c-plane, but not generated in a region on an m-plane. Thus, the side surface 20*b* of the electron transit layer 20 is on an m-plane, and the 2DEG 20*a* is not generated in this region of the electron transit layer 20, even when i-AlGaN is formed by epitaxial growth of the electron supply layer 30 that contacts this side surface 20*b*.

The 2DEG 20*a* is generated in a region in which the surface of the electron transit layer 20 is formed on a c-plane such that the surface is parallel to the surface 10*a* of the substrate 10. That is, the 2DEG 20*a* is generated in the first region 20A above the surface 21*a* of the first electron transit layer 21 in which the surface of the electron transit layer 20 is on a c-plane and in the second region 20B above the surface 11*a* of the back barrier layer 11, for example.

The electron transit layer 20 in the first region 20A between the gate electrode 41 and the source electrode 42 is formed of the first electron transit layer 21 and the second electron transit layer 22. The electron transit layer 20 in the second region 20B between the gate electrode 41 and the drain electrode 43 is formed of the second electron transit layer 22. Thus, the electron transit layer 20 is formed such that the thickness is greater in the first region 20A between the gate electrode 41 and the source electrode 42 than in the second region 20B between the gate electrode 41 and the drain electrode 43. Since the density of the 2DEG 20*a* depends on the thickness of the electron transit layer 20, the density of the 2DEG 20*a* in the electron transit layer 20 is higher in the first region 20A between the gate electrode 41 and the source electrode 42 than in the second region 20B between the gate electrode 41 and the drain electrode 43.

Then, a resist pattern, not illustrated, having an opening in a region in which an element isolation region is to be formed is formed by applying a photoresist and performing exposure and development with an exposure device, and dry etching using a chlorine-based gas or ion implantation with Ar or the like is performed. Accordingly, the element isolation region, not illustrated, is formed, and the resist pattern, not illustrated, is removed by an organic solvent or the like.

Figure 6B:
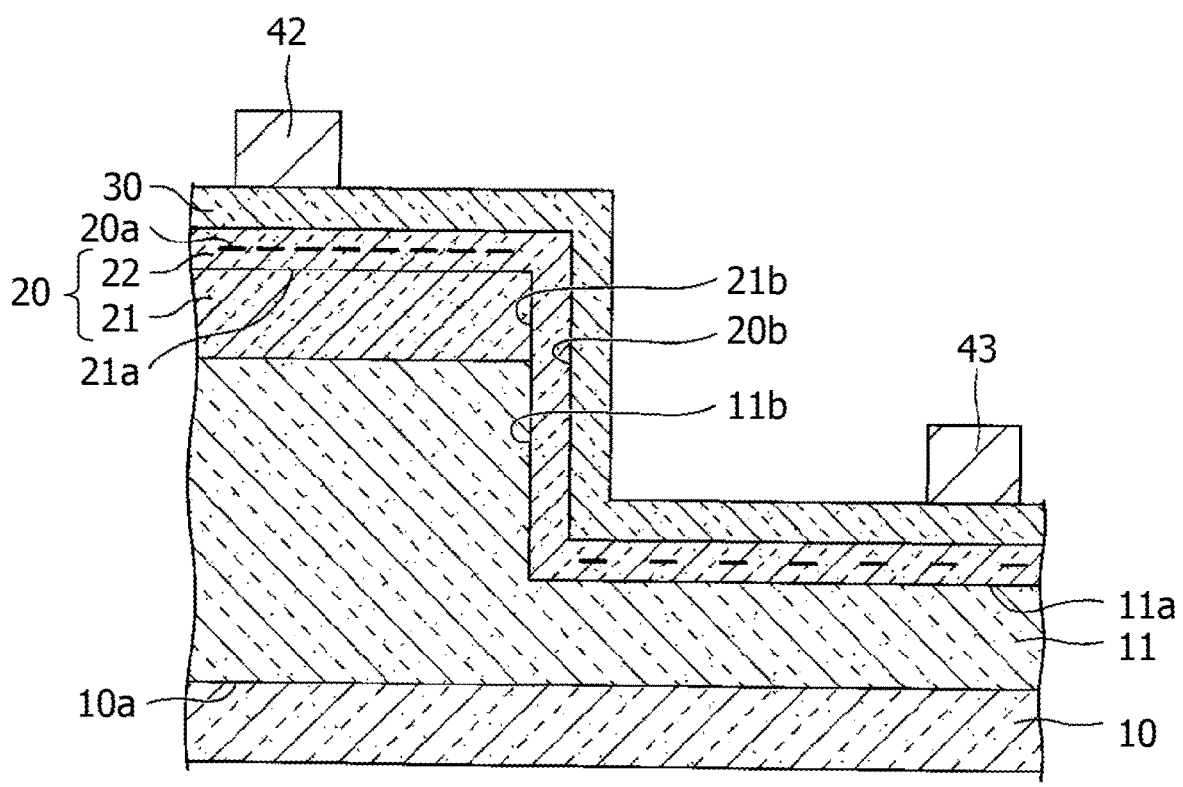

Next, as illustrated in FIG. 6B, the source electrode 42 and the drain electrode 43 are formed on the electron supply layer 30. Specifically, by applying a photoresist onto the electron supply layer 30 and performing exposure and development with an exposure device, a resist pattern, not illustrated, having an opening part in a region in which the source electrode 42 and the drain electrode 43 are to be formed is formed, for example. Then, by stacking and forming a film of titanium (Ti) with a film thickness of 20 nm and of aluminum (Al) with a film thickness of 200 nm by vapor deposition or the like, a metal film stack (of Ti/Al) is formed. Then, by immersion in an organic solvent or the like, the metal film stack formed on the resist pattern is removed together with the resist pattern by lift-off, so that the residual metal film stack forms the source electrode 42 and the drain electrode 43. Then, by performing heat treatment at a temperature between 400° C. and 1000° C., for example, a temperature of 550° C., in a nitrogen atmosphere, an ohmic contact is established.

Accordingly, the source electrode 42 is formed on the electron supply layer 30 in the first region 20A in which the electron transit layer 20 is formed of the first electron transit layer 21 and the second electron transit layer 22. The drain electrode 43 is formed on the electron supply layer 30 in the second region 20B in which the electron transit layer 20 is formed of the second electron transit layer 22.

Figure 7A:
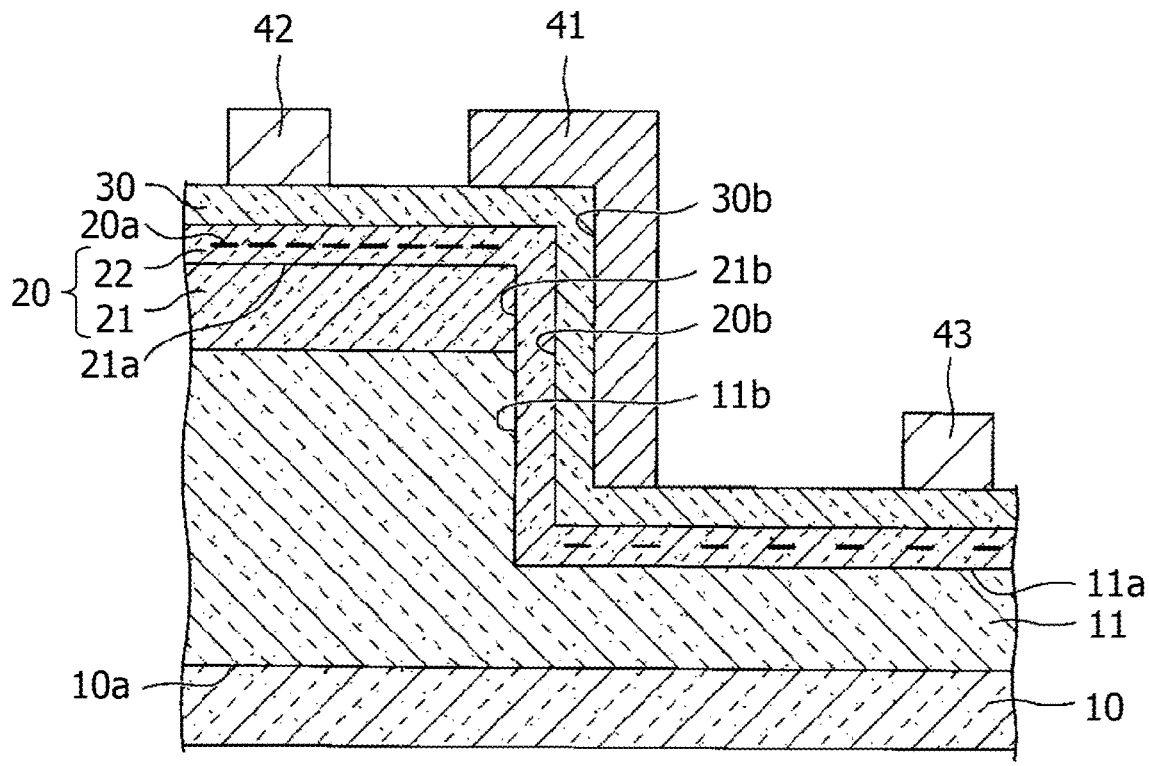
FIGS. 7A and 7B are views (3) of a process in the method of manufacturing a semiconductor device in the first embodiment.

Next, as illustrated in FIG. 7A, the gate electrode 41 is formed on the electron supply layer 30. The gate electrode 41 is formed between the source electrode 42 and the drain electrode 43, so as to contact the side surface 30b of the electron supply layer 30 covering the side surface 20b of the electron transit layer 20. Specifically, by applying a photoresist onto the electron supply layer 30 and performing exposure and development with an exposure device, a resist pattern, not illustrated, having an opening part in a region in which the gate electrode 41 is to be formed is formed, for example. Then, by stacking and forming a film of nickel (Ni) with a film thickness of 30 nm and of gold (Au) with a film thickness of 400 nm by vapor deposition or the like, a metal film stack (of Ni/Au) is formed. Then, by immersion in an organic solvent or the like, the metal film stack formed on the resist pattern is removed together with the resist pattern, so that the residual metal film stack forms the gate electrode 41. Accordingly, the gate electrode 41 is formed to cover the side surface 30b of the electron supply layer 30 and the vicinity thereof.

Figure 7B:
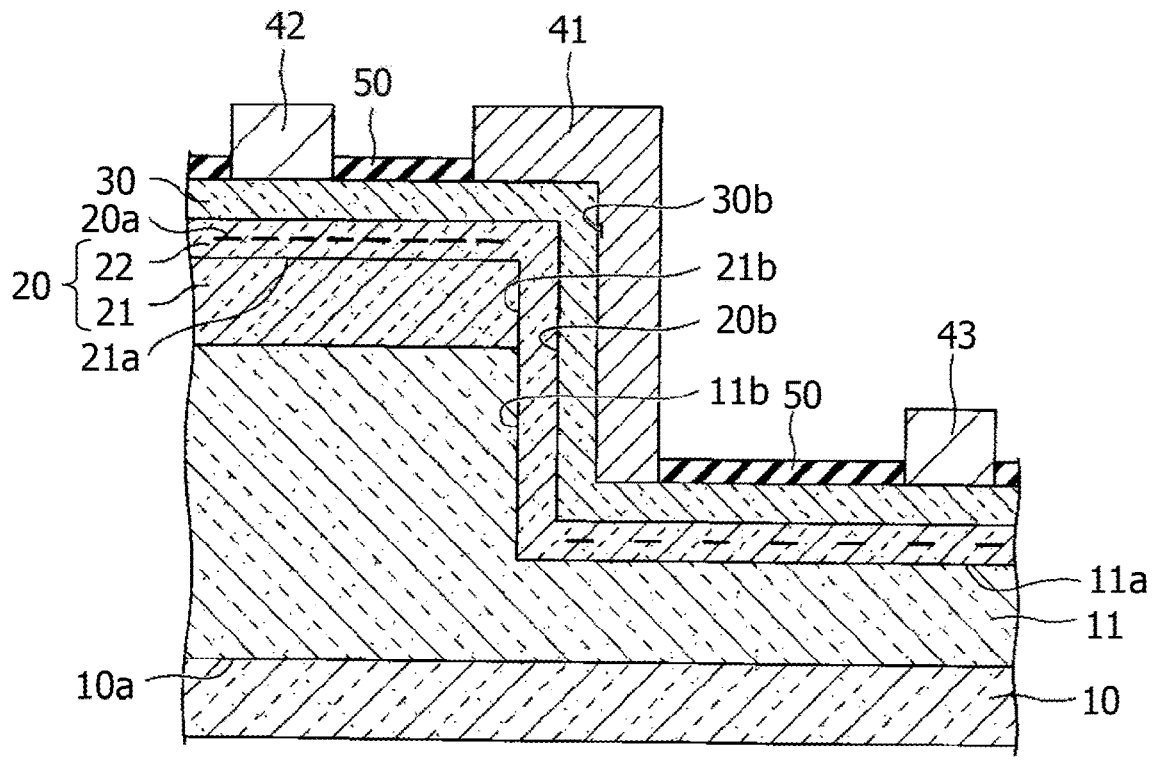

Next, as illustrated in FIG. 7B, the insulating film 50 is formed on the electron supply layer 30. The insulating film 50 is formed by forming a SiN film with a film thickness of 2 nm to 1000 nm, for example, 100 nm, by plasma chemical vapor deposition (CVD). The insulating film 50 may be formed by forming a film by atomic layer deposition (ALD) or sputtering of SiN or the like, for example. The insulating film 50 may be formed of $SiO_2$, $Al_2O_3$, AlN, or the like, other than SiN.

In the above manner, the semiconductor device in this embodiment may be manufactured.

Figure 8A:
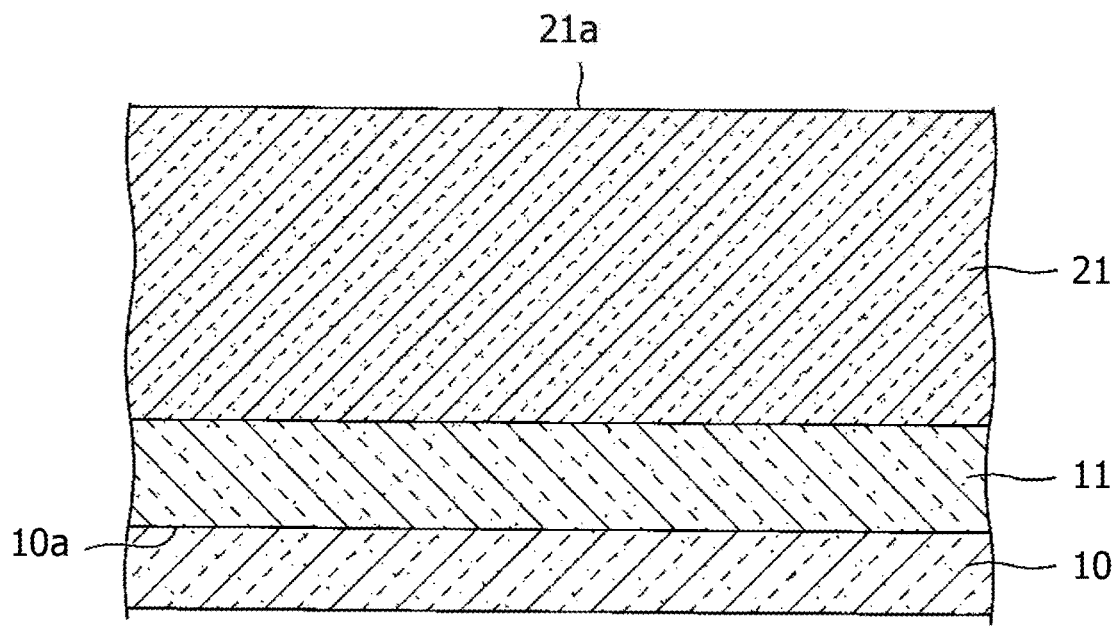
FIGS. 8A and 8B are view (1) of a process in a method of manufacturing another semiconductor device in the first embodiment.

A semiconductor device with a structure illustrated in FIG. 4 may be prepared by processes similar to the above. Specifically, as illustrated in FIG. 8A, the back barrier layer 11 and the first electron transit layer 21 are first sequentially stacked and formed by epitaxial growth of a nitride semiconductor on the substrate 10, for example.

Figure 8B:
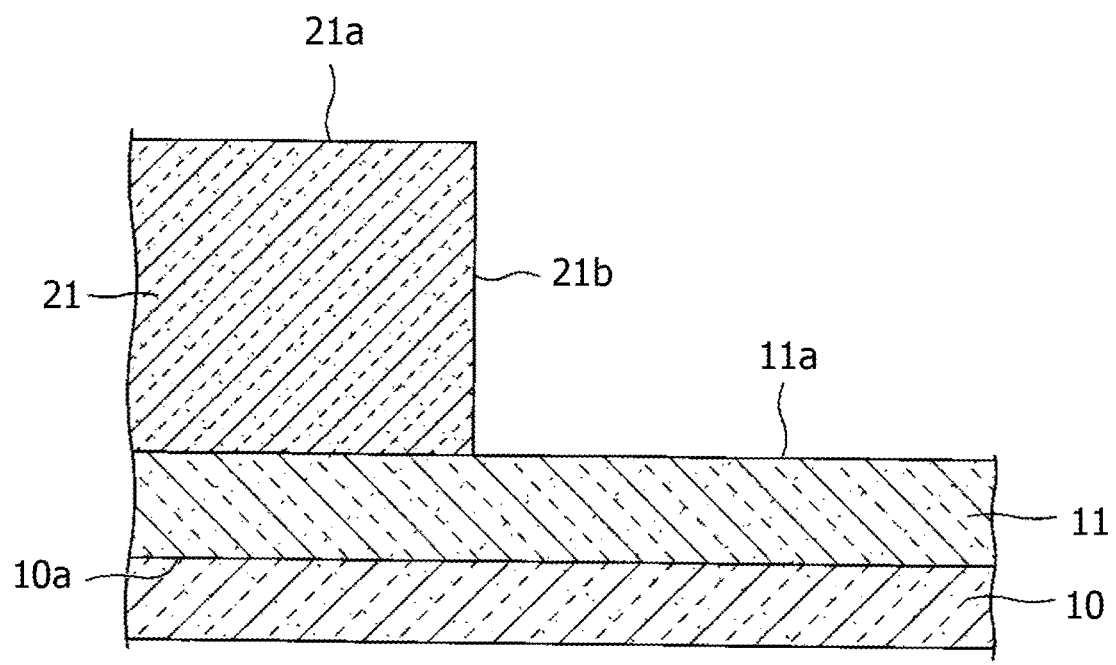

Next, as illustrated in FIG. 8B, the first electron transit layer 21 in a region in which part of the gate electrode 41 and the drain electrode 43 at a distance from the gate electrode 41 are to be formed is removed. Accordingly, a c-plane is exposed at the surface 11a of the back barrier layer 11, and an m-plane is exposed at the side surface 21b of the first electron transit layer 21.

Figure 9:
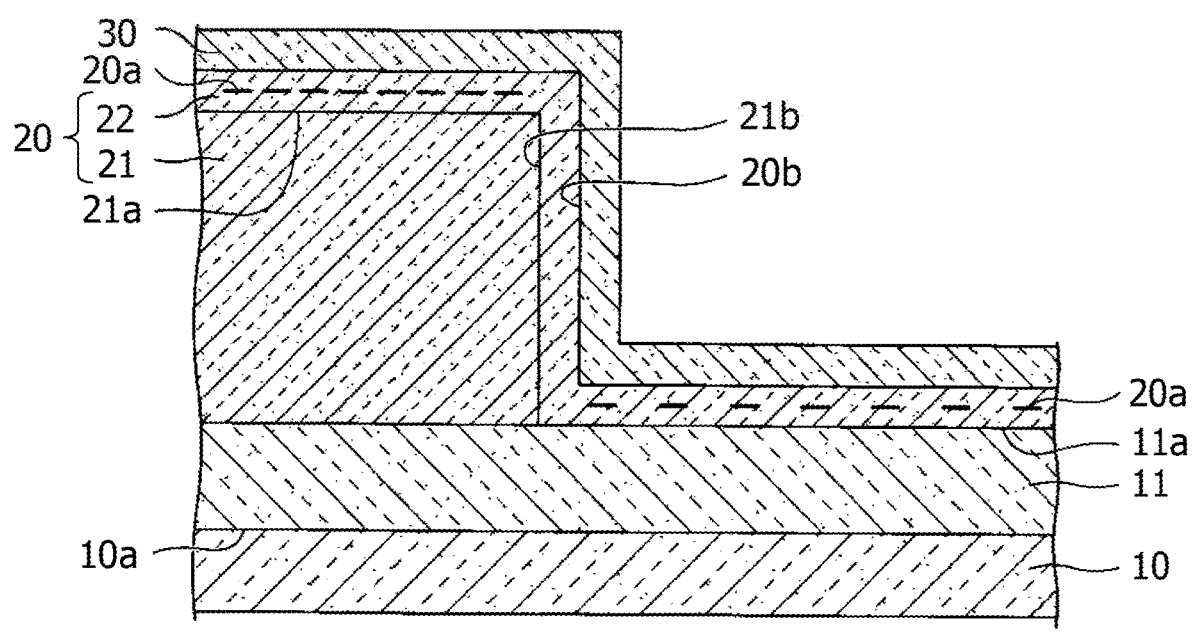
FIG. 9 is a view (2) of a process in the method of manufacturing another semiconductor device in the first embodiment.

Next, as illustrated in FIG. 9, the second electron transit layer 22 and the electron supply layer 30 are sequentially formed by MOVPE on the surface 21a of the first electron transit layer 21, the side surface 21b of the first electron transit layer 21, and the surface 11a of the back barrier layer 11. The electron supply layer 30 is formed of i-AlGaN with a thickness of about 20 nm. The electron transit layer 20 is formed of the first electron transit layer 21 and the second electron transit layer 22.

By the above processes, the semiconductor device with the structure illustrated in FIG. 4 may be manufactured.

The epitaxial structure of the semiconductor device in this embodiment is an example, and application is possible also to field effect transistors with other structures.

For the substrate 10, a substrate formed of sapphire, Si, GaAs, or the like other than SiC may be used. Alternatively, a conductive substrate doped with an impurity element is acceptable, or a semi-insulating substrate not doped with an impurity element is acceptable.

The structure of the source electrode 42 and the drain electrode 43 in the above description is an example, and may be a single layer or may be formed of other multiple layers. The source electrode 42 and the drain electrode 43 may be formed of another formation method.

Second Embodiment (Semiconductor Device)

Figure 10:
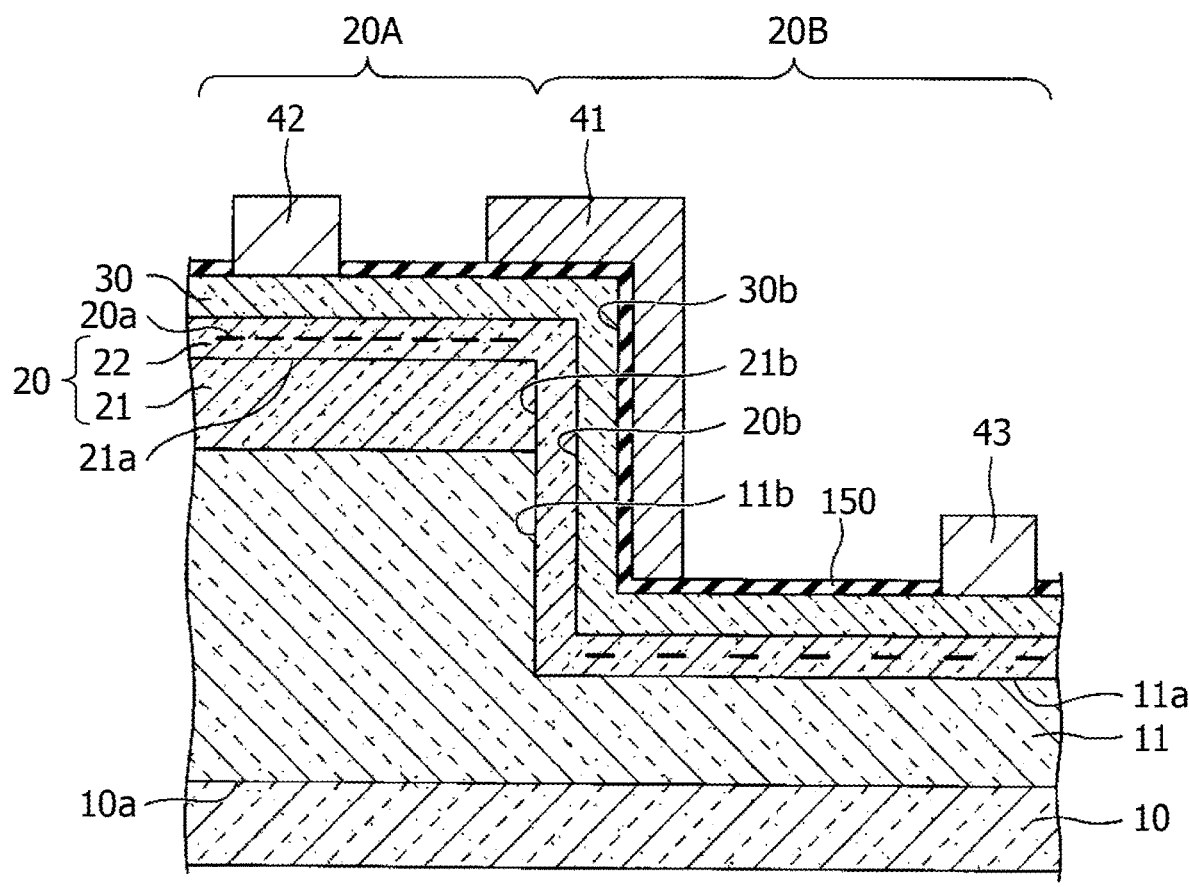
FIG. 10 is a structure view of a semiconductor device in a second embodiment.

Next, a semiconductor device in a second embodiment will be described based on FIG. 10. In the semiconductor device in this embodiment, an insulating film 150, which is a gate insulating film, is formed on the electron supply layer 30, and the gate electrode 41 is formed on the insulating film 150 covering the side surface 30b of the electron supply layer 30. Thus, the insulating film 150 is formed between the electron supply layer 30 and the gate electrode 41. The source electrode 42 and the drain electrode 43 are formed on the electron supply layer 30. In this embodiment, forming the insulating film 150 allows for a high withstand voltage between the gate electrode 41 and the source electrode 42. The insulating film 150 is formed of aluminum oxide ($Al_2O_3$), for example.

(Method of Manufacturing Semiconductor Device)

Next, a method of manufacturing a semiconductor device in this embodiment will be described.

Figure 11A:
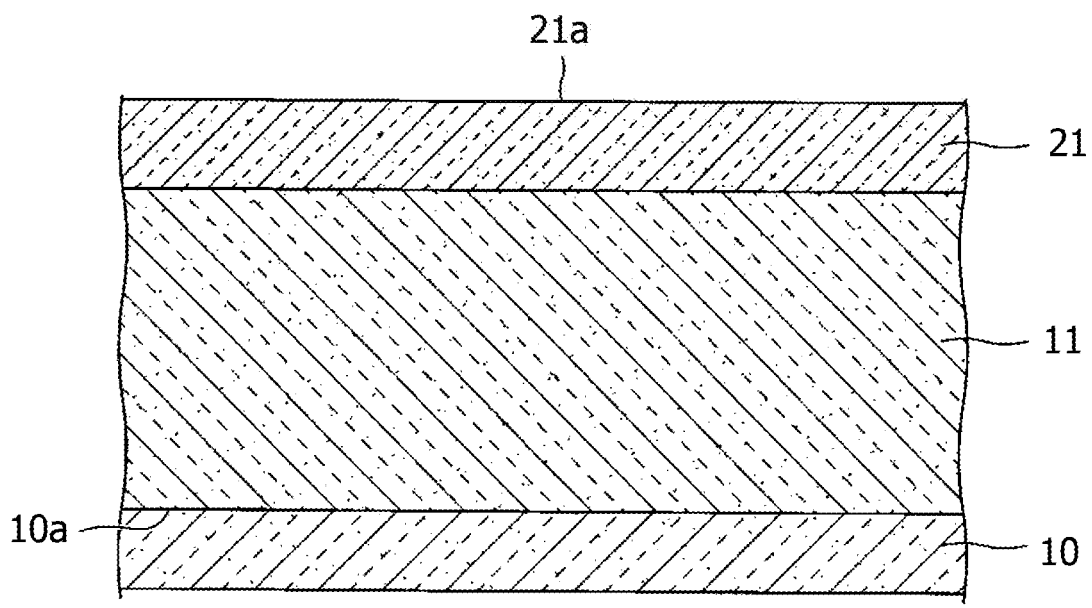
FIGS. 11A and 11B are views (1) of a process in a method of manufacturing a semiconductor device in the second embodiment.

First, as illustrated in FIG. 11A, the back barrier layer 11 and the first electron transit layer 21 are sequentially stacked and formed by epitaxial growth of a nitride semiconductor on the substrate 10.

Figure 11B:
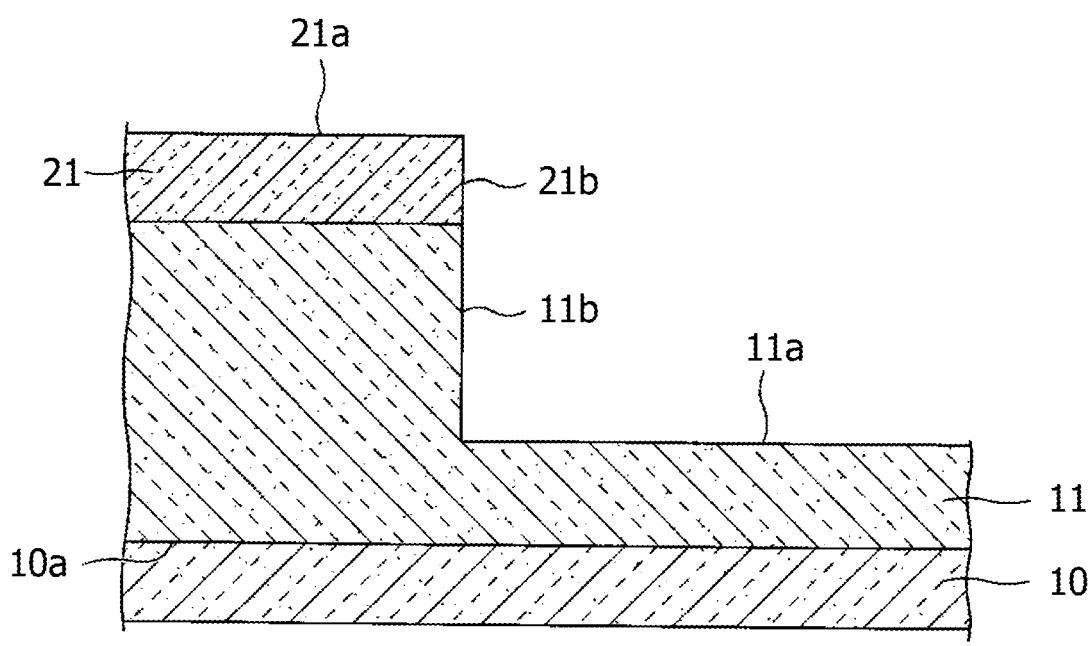

Next, as illustrated in FIG. 11B, part of the first electron transit layer 21 and the back barrier layer 11 in a region in which the drain electrode 43 is to be formed is removed. Accordingly, a c-plane is exposed at the surface 11a of the back barrier layer 11, and an m-plane is exposed at the side surface 21b of the first electron transit layer 21 and the side surface 11b of the back barrier layer 11.

Figure 12A:
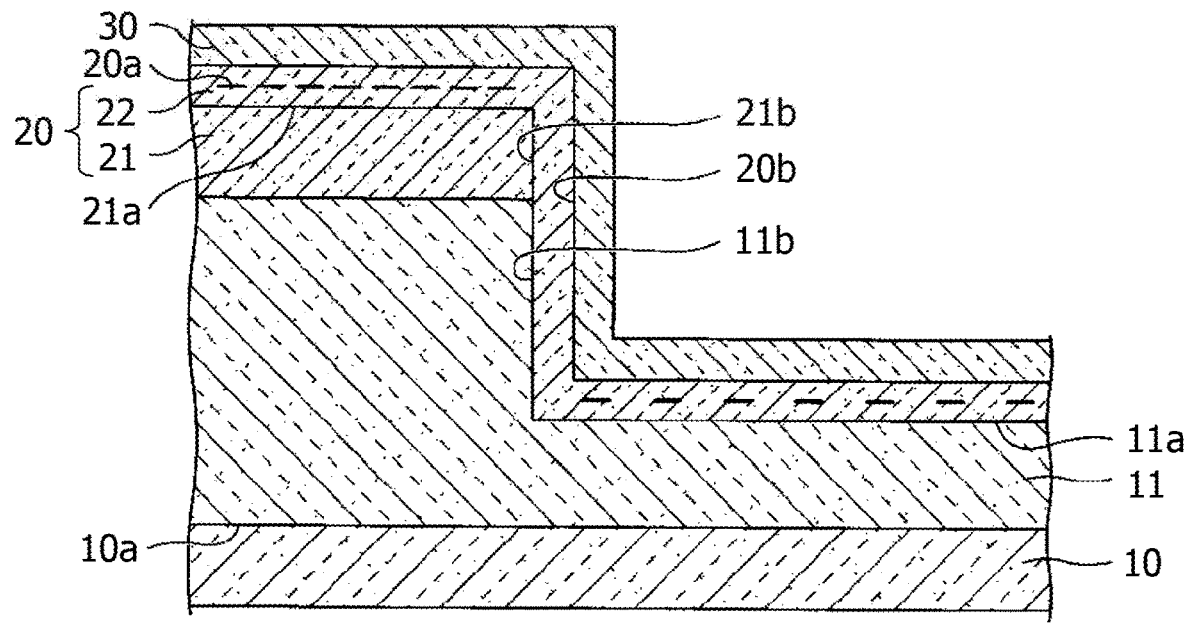
FIGS. 12A and 12B are views (2) of a process in the method of manufacturing a semiconductor device in the second embodiment.

Next, as illustrated in FIG. 12A, the second electron transit layer 22 and the electron supply layer 30 are sequentially formed by MOVPE on the surface 21a of the first electron transit layer 21, the side surface 21b of the first electron transit layer 21, the side surface 11b of the back barrier layer 11, and the surface 11a of the back barrier layer 11.

Figure 12B:
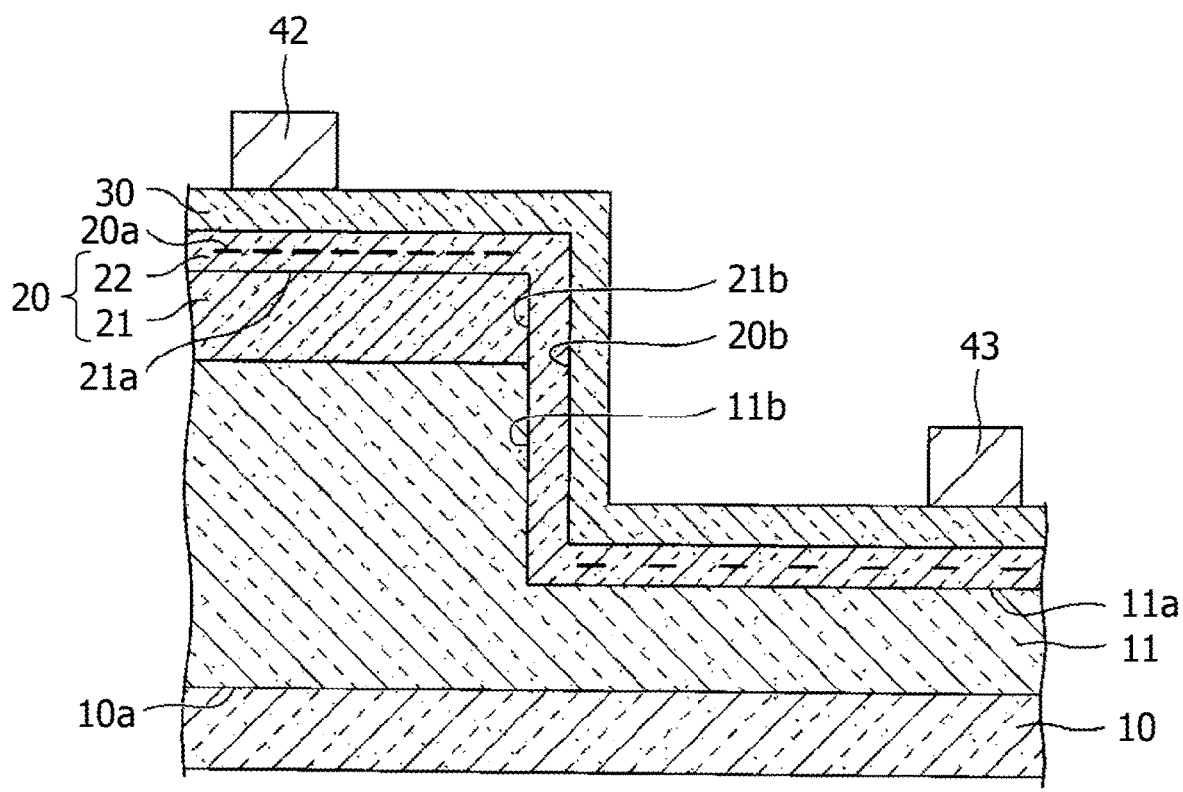

Next, as illustrated in FIG. 12B, the source electrode 42 and the drain electrode 43 are formed on the electron supply layer 30. Then, by performing heat treatment at a temperature between 400° C. and 1000° C., for example, a temperature of 550° C., in a nitrogen atmosphere, an ohmic contact is established.

Figure 13A:
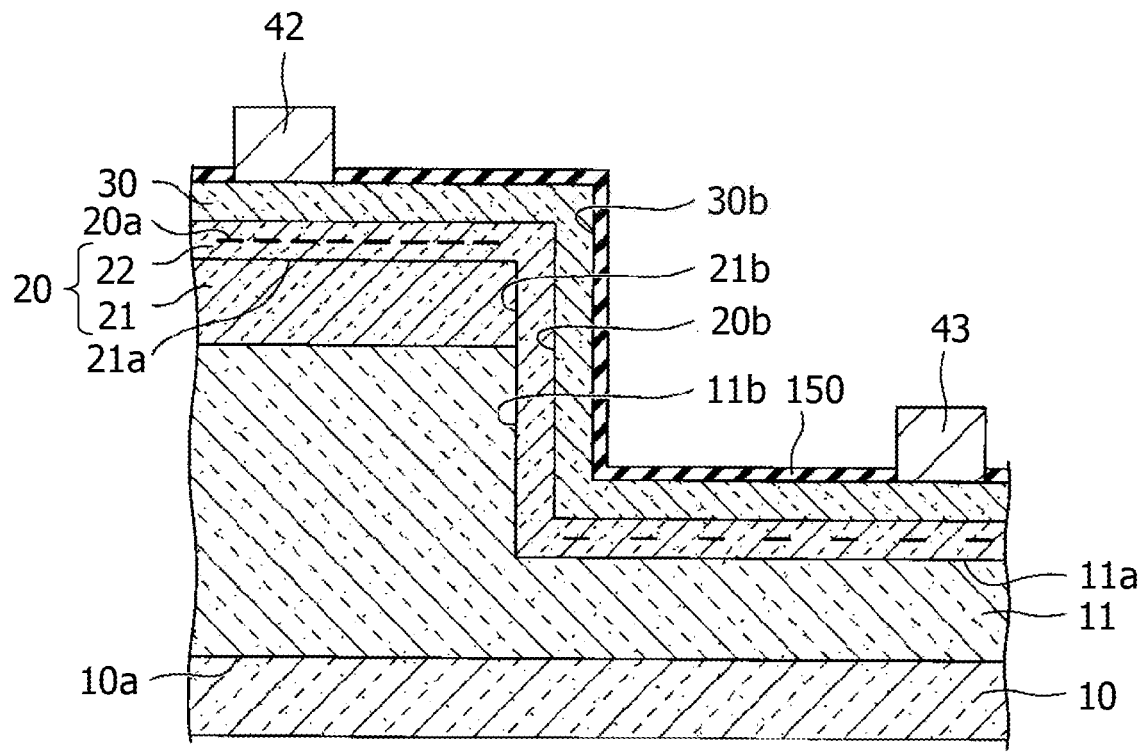
FIGS. 13A and 13B are view (3) of a process in the method of manufacturing a semiconductor device in the second embodiment.

Next, as illustrated in FIG. 13A, the insulating film 150 is formed on the exposed electron supply layer 30. The insulating film 150 is formed by forming an $Al_2O_3$ film with a film thickness of 2 nm to 1000 nm, for example, 100 nm, by plasma CVD or ALD. Accordingly, surfaces at which the electron supply layer 30 has been exposed, including the side surface 30b of the electron supply layer 30, are covered by the insulating film 150.

Figure 13B:
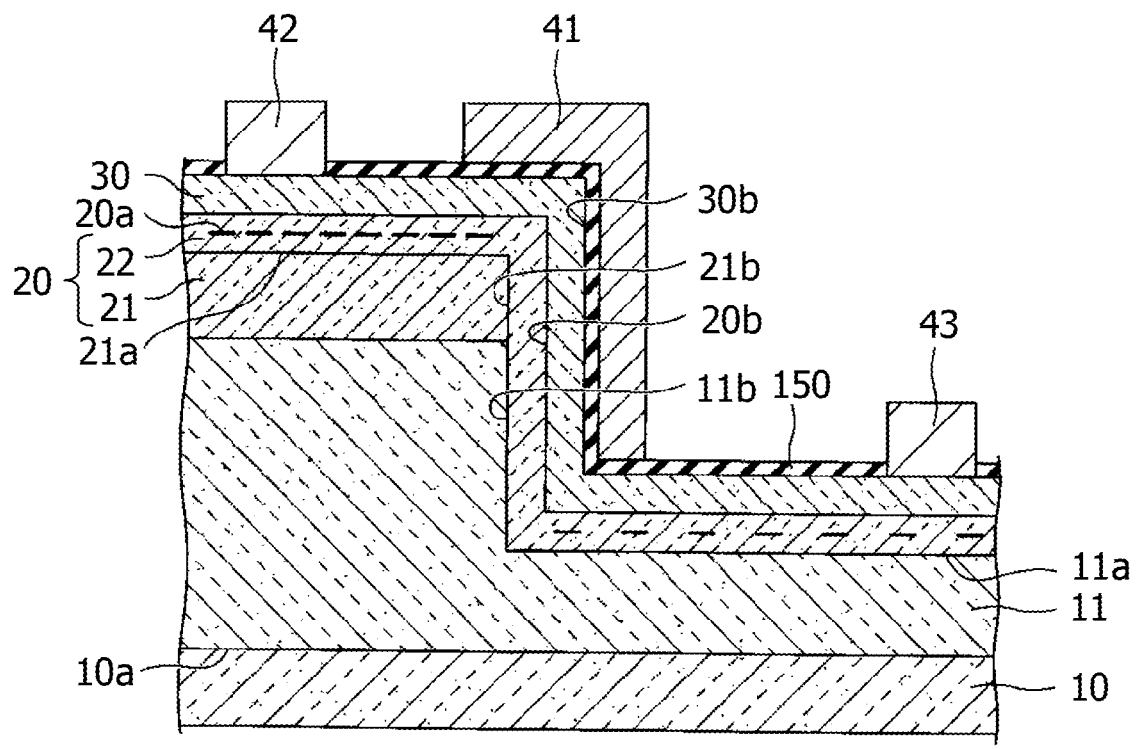

Next, as illustrated in FIG. 13B, the gate electrode 41 is formed on the insulating film 150. The gate electrode 41 is formed between the source electrode 42 and the drain electrode 43, so as to contact the insulating film 150 covering the side surface 30b of the electron supply layer 30. Specifically, by applying a photoresist onto the insulating film 150 and performing exposure and development with an exposure device, a resist pattern, not illustrated, having an opening part in a region in which the gate electrode 41 is to be formed is formed, for example. Then, by stacking and forming a film of nickel (Ni) with a film thickness of 30 nm and of gold (Au) with a film thickness of 400 nm by vapor deposition or the like, a metal film stack (of Ni/Au) is formed. Then, by immersion in an organic solvent or the like, the metal film stack formed on the resist pattern is removed together with the resist pattern, so that the residual metal film stack forms the gate electrode 41.

In the above manner, the semiconductor device in this embodiment may be manufactured.

Matters other than the above are similar to the first embodiment.

Third Embodiment (Semiconductor Device)

Figure 14:
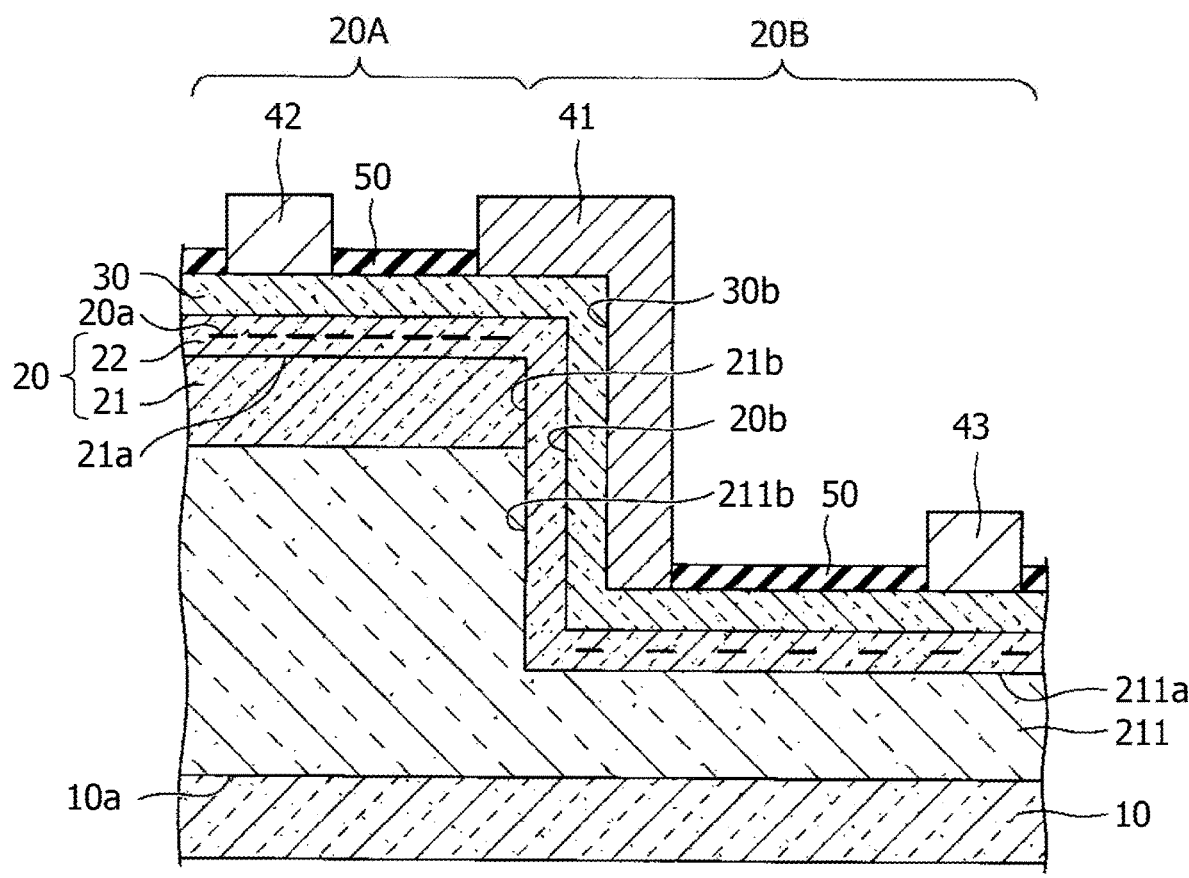
FIG. 14 is a structure view of a semiconductor device in a third embodiment.

Next, a semiconductor device in a third embodiment will be described based on FIG. 14. The semiconductor device in this embodiment has a structure in which a back barrier layer 211 formed on the substrate 10 is formed of p-GaN. Since the back barrier layer 211 formed of p-GaN lattice-matches the electron transit layer 20 formed of i-GaN, the crystallinity of the electron transit layer 20 is improved, and the characteristics and reliability of the semiconductor device may be improved.

(Method of Manufacturing Semiconductor Device)

Next, a method of manufacturing a semiconductor device in this embodiment will be described.

Figure 15A:
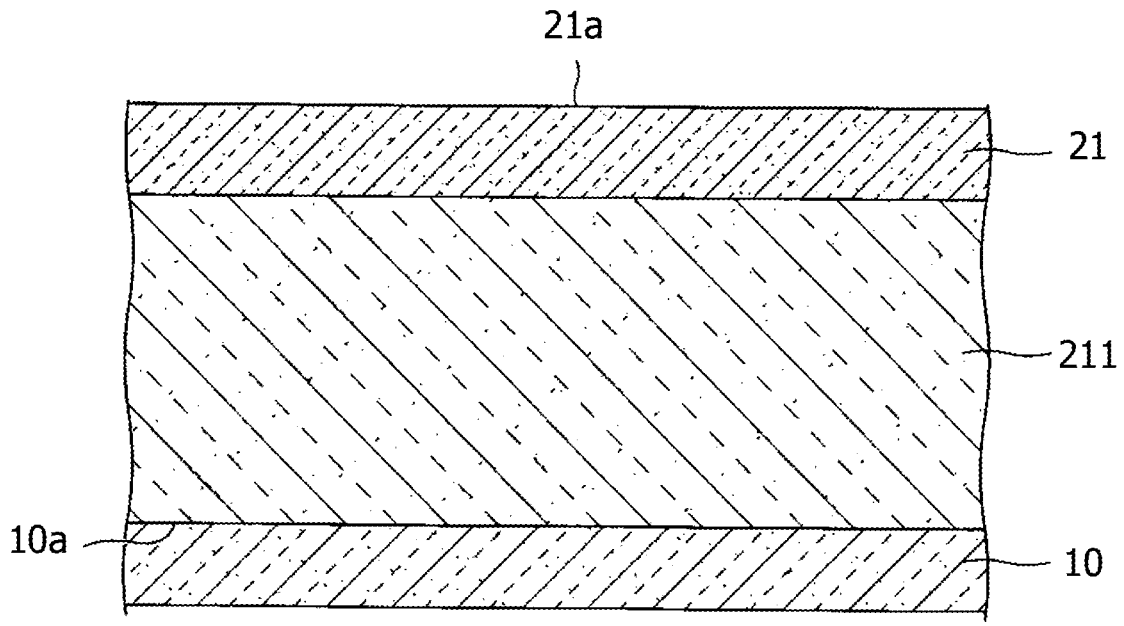
FIGS. 15A and 15B are views (1) of a process in a method of manufacturing a semiconductor device in the third embodiment.

First, as illustrated in FIG. 15A, the back barrier layer 211 and the first electron transit layer 21 are sequentially stacked and formed by epitaxial growth of a nitride semiconductor on the substrate 10. In this embodiment, the back barrier layer 211 is formed by causing epitaxial growth of p-GaN by metal-organic vapor phase epitaxy, and is doped with Mg as a p-type impurity element.

Figure 15B:
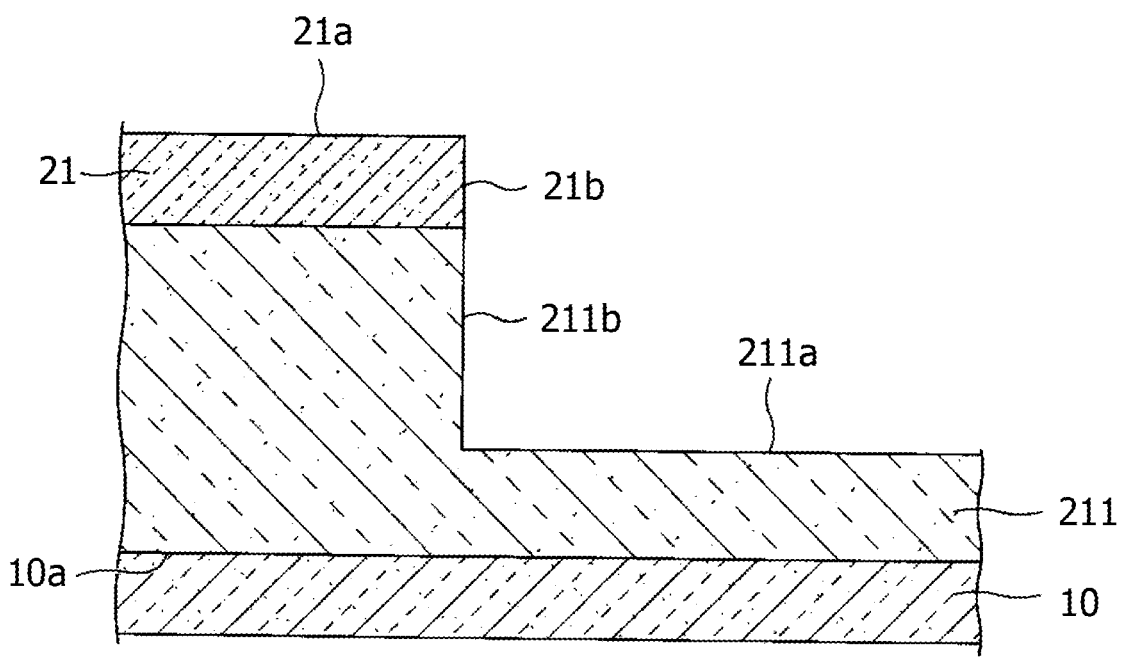

Next, as illustrated in FIG. 15B, part of the first electron transit layer 21 and the back barrier layer 211 in a region in which the drain electrode 43 is to be formed is removed. Accordingly, a c-plane is exposed at a surface 211a of the back barrier layer 211, and an m-plane is exposed at the side surface 21b of the first electron transit layer 21 and a side surface 211b of the back barrier layer 211.

Figure 16A:
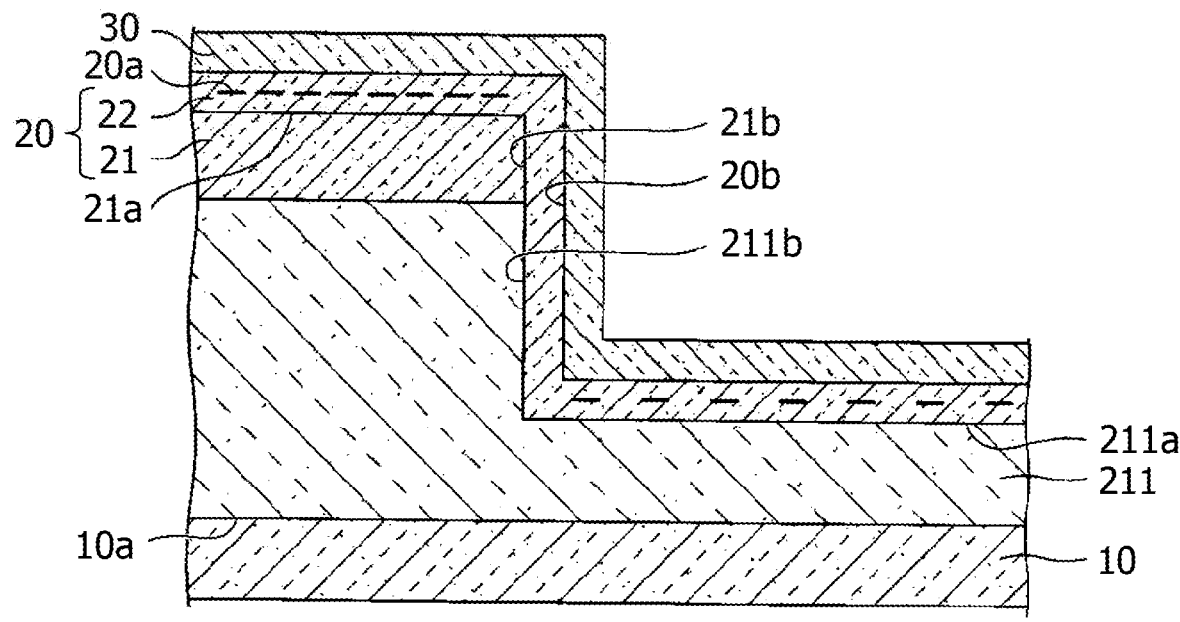
FIGS. 16A and 16B are views (2) of a process in the method of manufacturing a semiconductor device in the third embodiment.

Next, as illustrated in FIG. 16A, the second electron transit layer 22 and the electron supply layer 30 are sequentially formed on the surface 21a of the first electron transit layer 21, the surface 211a of the back barrier layer 211, the side surface 21b of the first electron transit layer 21, and the side surface 211b of the back barrier layer 211.

Figure 16B:
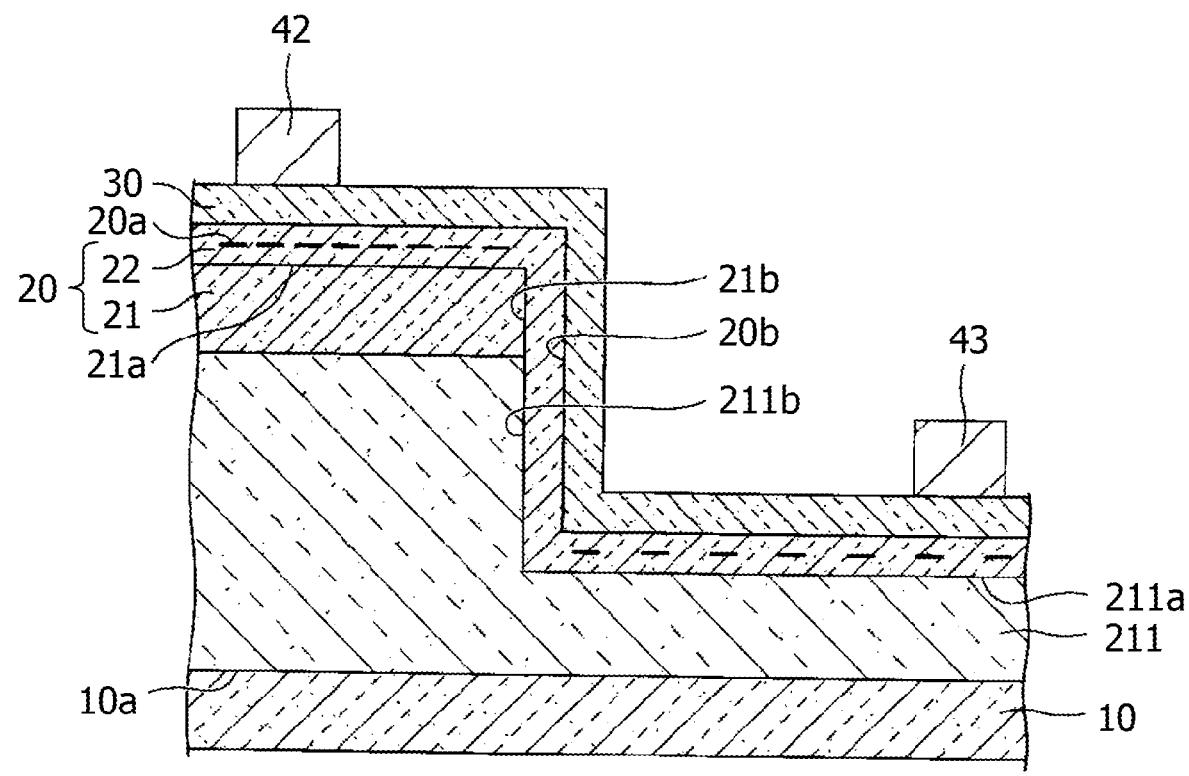

Next, as illustrated in FIG. 16B, the source electrode 42 and the drain electrode 43 are formed on the electron supply layer 30. Then, by performing heat treatment at a temperature between 400° C. and 1000° C., for example, a temperature of 550° C., in a nitrogen atmosphere, an ohmic contact is established.

Figure 17A:
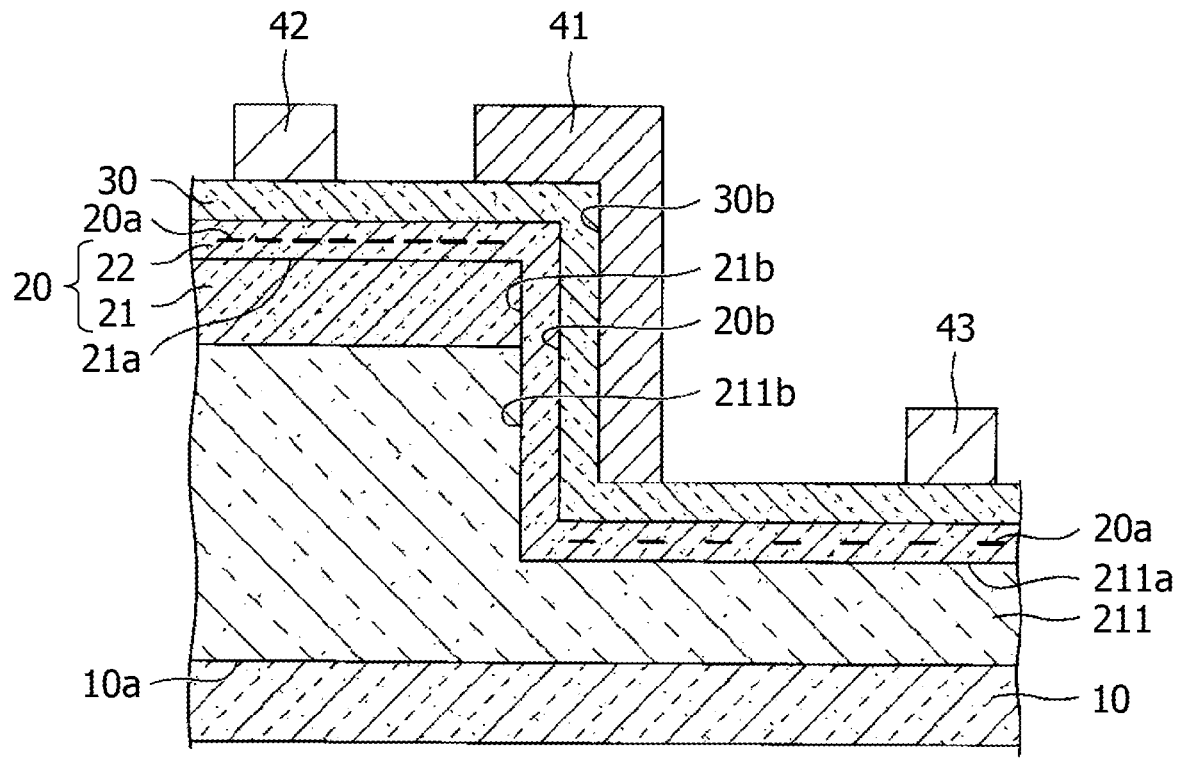
FIGS. 17A and 17B are views (3) of a process in the method of manufacturing a semiconductor device in the third embodiment.

Next, as illustrated in FIG. 17A, the gate electrode 41 is formed on the electron supply layer 30. The gate electrode 41 is formed between the source electrode 42 and the drain electrode 43, so as to contact the side surface 30b of the electron supply layer 30 covering the side surface 20b of the electron transit layer 20.

Figure 17B:
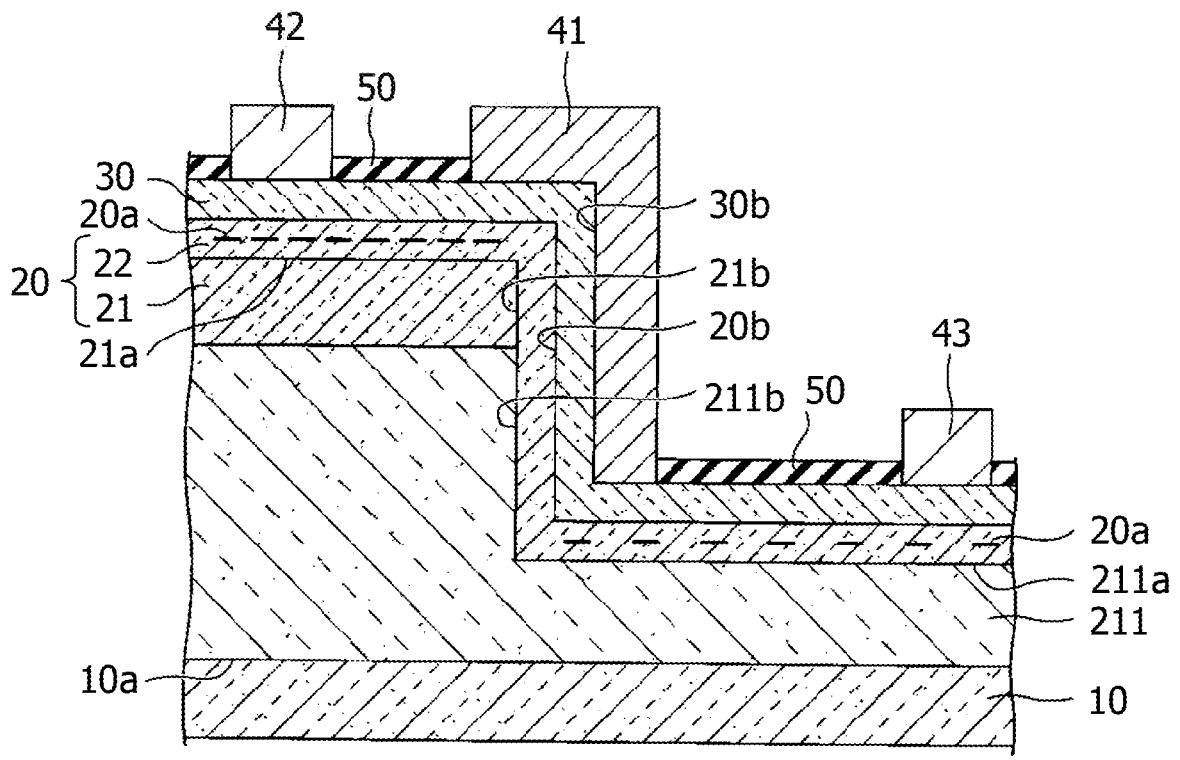

Next, as illustrated in FIG. 17B, the insulating film 50 is formed on the electron supply layer 30. The insulating film 50 is formed by forming a SiN film with a film thickness of 2 nm to 1000 nm, for example, 100 nm, by plasma CVD.

In the above manner, the semiconductor device in this embodiment may be manufactured.

Matters other than the above are similar to the first embodiment.

Fourth Embodiment

Next, a fourth embodiment will be described. This embodiment concerns a semiconductor device, a power supply device, and a high frequency amplifier.

Figure 18:
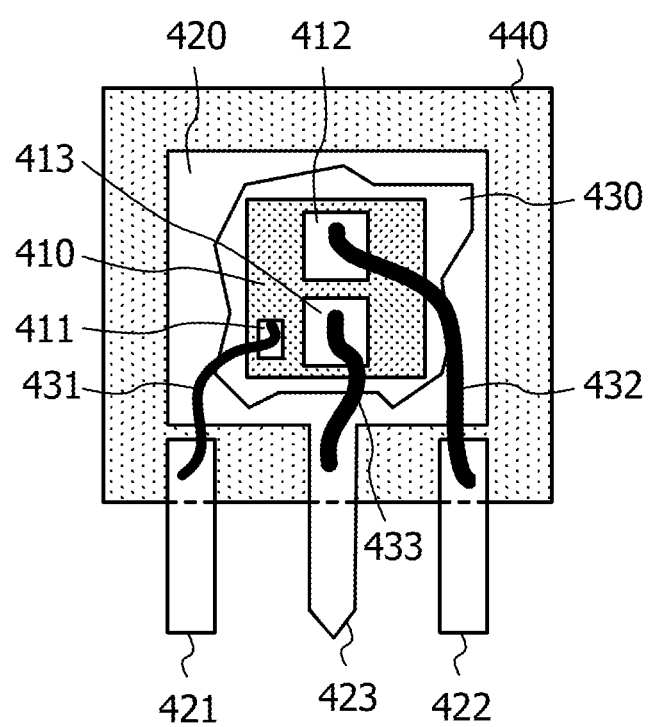
FIG. 18 is an illustrative view of a semiconductor device with discrete packaging in a fourth embodiment.

In the semiconductor device in this embodiment, the semiconductor device in any one of the first to third embodiments is discretely packaged. The semiconductor device with such discrete packaging will be described based on FIG. 18. FIG. 18 schematically illustrates the inside of the discretely packaged semiconductor device. The electrode arrangements and the like differ from those discussed in the first to third embodiments.

First, the semiconductor device manufactured in the first to third embodiments is cut by dicing or the like to thereby form a semiconductor chip 410 of a HEMT with a GaN-based semiconductor material. The semiconductor chip 410 is fixed onto a lead frame 420 with a die attach adhesive 430 of solder or the like. The semiconductor chip 410 corresponds to the semiconductor device in the first to third embodiments.

Next, a gate electrode 411 is connected to a gate lead 421 by a bonding wire 431, a source electrode 412 is connected to a source lead 422 by a bonding wire 432, and a drain electrode 413 is connected to a drain lead 423 by a bonding wire 433. The bonding wires 431, 432, and 433 are formed of a metal material such as Al. In this embodiment, the gate electrode 411 is a gate electrode pad, and is connected with the gate electrode 41 of the semiconductor device in the first to third embodiments. The source electrode 412 is a source electrode pad, and is connected with the source electrode 42 of the semiconductor device in the first to third embodiments. The drain electrode 413 is a drain electrode pad, and is connected with the drain electrode 43 of the semiconductor device in the first to third embodiments.

Next, resin sealing with a mold resin 440 is performed by a transfer molding method. In this manner, the semiconductor device with discrete packaging of a HEMT using a GaN-based semiconductor material may be prepared.

Next, the power supply device and the high frequency amplifier in this embodiment will be described. The power supply device and the high frequency amplifier in this embodiment are a power supply device and a high frequency amplifier that use the semiconductor device in any one of the first to third embodiments.

Figure 19:
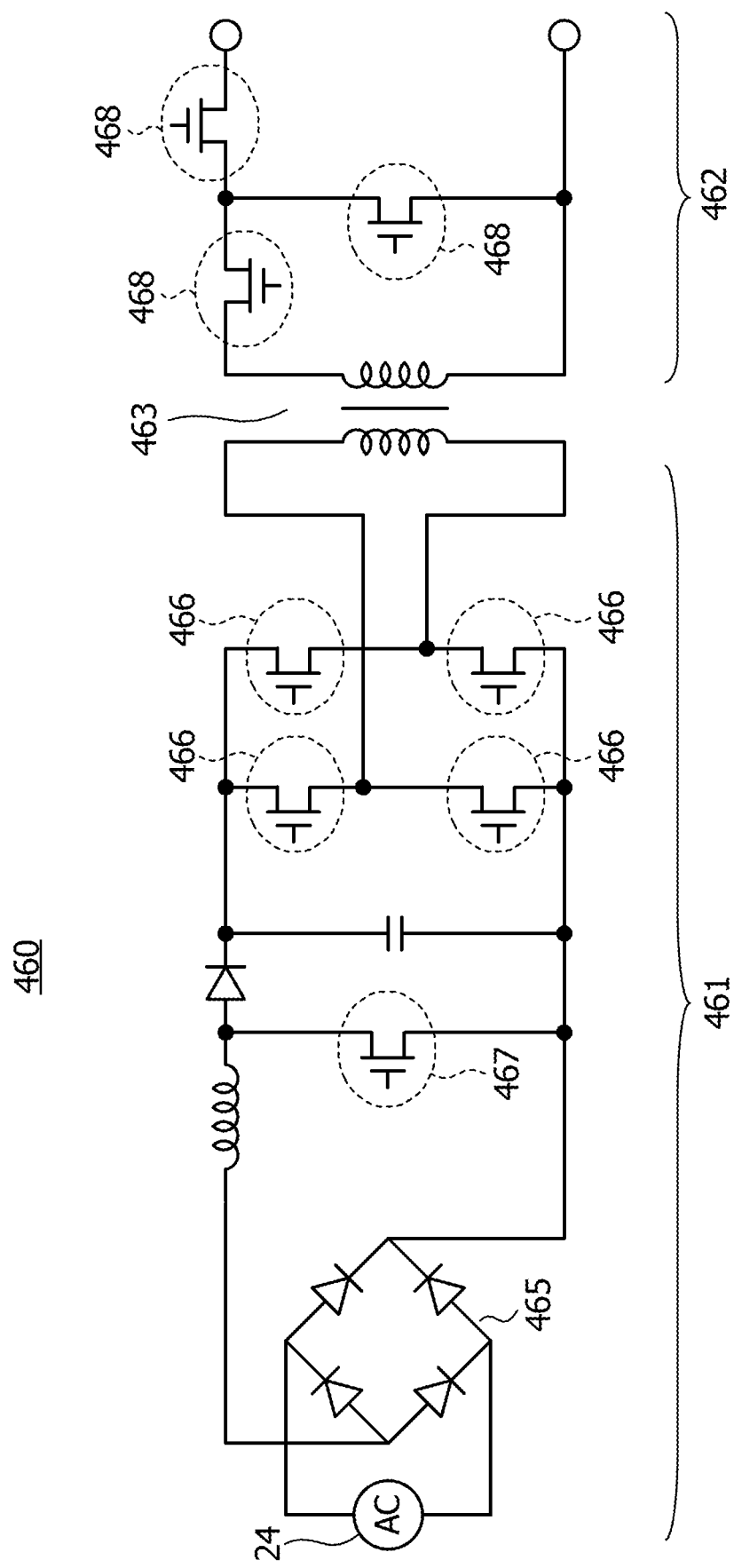
FIG. 19 is a circuit diagram of a power supply device in the fourth embodiment.

First, based on FIG. 19, the power supply device in this embodiment will be described. A power supply device 460 in this embodiment includes a high voltage primary circuit 461, a low voltage secondary circuit 462, and a transformer 463 arranged between the primary circuit 461 and the secondary circuit 462. The primary circuit 461 includes an AC power supply 464, a so-called bridge rectifier circuit 465, a plurality of (four, in an example illustrated in FIG. 19) switching elements 466, one switching element 467, and the like. The secondary circuit 462 includes a plurality of (three, in the example illustrated in FIG. 19) switching elements 468. In the example illustrated in FIG. 19, the semiconductor device in the first to third embodiments is used as the switching elements 466 and 467 of the primary circuit 461. The switching elements 466 and 467 of the primary circuit 461 are preferably normally-off semiconductor devices. For the switching elements 468 used in the secondary circuit 462, a normal metal insulator semiconductor field effect transistor (MISFET) formed of silicon is used.

Figure 20:
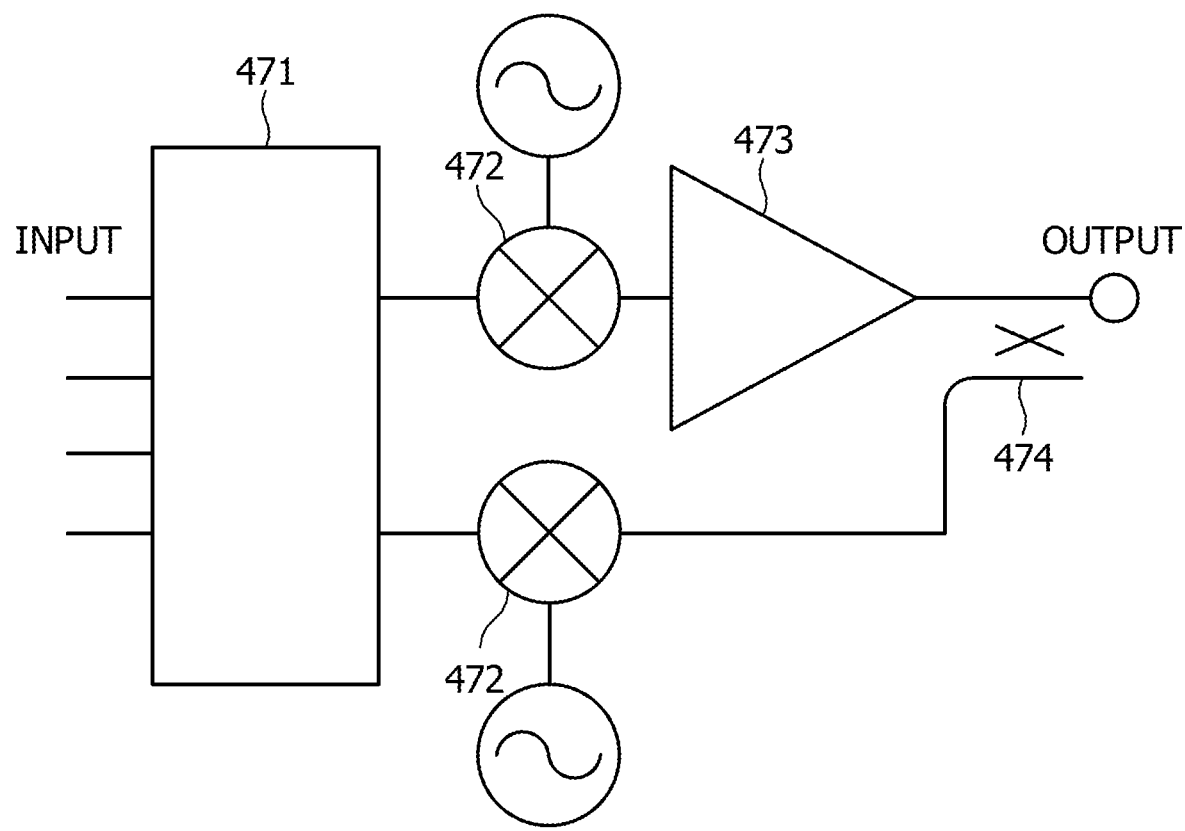
FIG. 20 is a structure view of a high frequency amplifier in the fourth embodiment.

Next, based on FIG. 20, the high frequency amplifier in this embodiment will be described. A high frequency amplifier 470 in this embodiment may be applied, for example, to a power amplifier for a mobile phone base station. The high frequency amplifier 470 includes a digital predistortion circuit 471, a mixer 472, a power amplifier 473, and a directional coupler 474. The digital predistortion circuit 471 compensates for a non-linear distortion of an input signal. The mixer 472 mixes an input signal for which a non-linear distortion has been compensated and an AC signal. The power amplifier 473 amplifies an input signal mixed with an AC signal. In an example illustrated in FIG. 20, the power amplifier 473 includes the semiconductor device in any one of the first to third embodiments. The directional coupler 474 performs monitoring or the like of an input signal or an output signal. Through switching of a switch, for example, in a circuit illustrated in FIG. 20, it is possible for an output signal to be mixed with an AC signal by the mixer 472 and be sent to the digital predistortion circuit 471.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
a back barrier layer formed of a compound semiconductor over a substrate;
a first electron transit layer formed of a compound semiconductor in such a manner that a bottom surface of the first electron transit layer is physically in contact with an upper surface of the back barrier layer;
an opening formed in the first electron transit layer and the back barrier layer;
a second electron transit layer formed of a compound semiconductor over the first electron transit layer, a side surface of the first electron transit layer at a side surface within the opening, a side surface of the back barrier layer at a side surface within the opening, and a surface of the back barrier layer at a bottom surface within the opening;
an electron supply layer formed of a compound semiconductor over the second electron transit layer;
a source electrode formed over the electron supply layer in a region in which the first electron transit layer is formed;
a drain electrode formed over the electron supply layer within the opening; and
a gate electrode formed to cover a side surface of the electron supply layer at a side surface within the opening from an edge part of the opening,
the first electron transit layer and the second electron transit layer between the source electrode and the gate electrode have a combined thickness greater than a thickness of the second electron transit layer between the gate electrode and the drain electrode,
the side surface of the first electron transit layer at the side surface within the opening is covered entirely by the second electron transit layer.

2. The semiconductor device according to claim 1, wherein the back barrier layer, the first electron transit layer, the second electron transit layer, and the electron supply layer are formed of a nitride semiconductor, and wherein the side surface of the first electron transit layer and the side surface of the second electron transit layer are on an m-plane.

3. The semiconductor device according to claim 2, wherein, in the first electron transit layer, a surface parallel to a surface of the substrate is on a c-plane.

4. The semiconductor device according to claim 1, wherein, in the second electron transit layer, a two-dimensional electron gas is generated in a vicinity of a boundary with the electron supply layer at a surface parallel to a surface of the substrate.

5. The semiconductor device according to claim 1, wherein the first electron transit layer and the second electron transit layer are formed of a material that includes GaN, and wherein the electron supply layer is formed of a material that includes AlGaN.

6. The semiconductor device according to claim 5, wherein the back barrier layer is formed of a material that includes AlGaN or AlN.

7. The semiconductor device according to claim 5, wherein the back barrier layer is formed of a material that includes p-GaN or p-AlGaN.

8. The semiconductor device according to claim 1, wherein an insulating film is formed between the electron supply layer and the gate electrode.

9. A power supply device comprising:
a semiconductor device, wherein the semiconductor device includes a back barrier layer formed of a compound semiconductor on a substrate, a first electron transit layer formed of a compound semiconductor in such a manner that a bottom surface of the first electron transit layer is physically in contact with an upper surface of the back barrier layer, an opening formed in the first electron transit layer and the back barrier layer, a second electron transit layer formed of a compound semiconductor over the first electron transit layer, a side surface of the first electron transit layer at a side surface within the opening, a side surface of the back barrier layer at a side surface within the opening, and a surface of the back barrier layer at a bottom surface within the opening, an electron supply layer formed of a compound semiconductor over the second electron transit layer, a source electrode formed over the electron supply layer in a region in which the first electron transit layer is formed, a drain electrode formed over the electron supply layer within the opening, and a gate electrode formed to cover a side surface of the electron supply layer at a side surface within the opening from an edge part of the opening, and wherein the first electron transit layer and the second electron transit layer between the source electrode and the gate electrode have a combined thickness greater than a thickness of the second electron transit layer between the gate electrode and the drain electrode, the side surface of the first electron transit layer at the side surface within the opening is covered entirely by the second electron transit layer.

* * * * *